(12) United States Patent
Zheng et al.

(10) Patent No.: US 12,190,948 B2
(45) Date of Patent: Jan. 7, 2025

(54) DATA WRITING AND READING METHOD AND APPARATUS, AND SYSTEM

(71) Applicant: Huawei Technologies Co., Ltd., Shenzhen (CN)

(72) Inventors: Chao Zheng, Shenzhen (CN); Sheng Liu, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 181 days.

(21) Appl. No.: 17/940,407

(22) Filed: Sep. 8, 2022

(65) Prior Publication Data

US 2023/0051086 A1   Feb. 16, 2023

Related U.S. Application Data

(63) Continuation of application No. PCT/CN2021/080267, filed on Mar. 11, 2021.

(30) Foreign Application Priority Data

Mar. 13, 2020   (CN) .......................... 202010176209.9

(51) Int. Cl.
    G11C 11/56   (2006.01)
    G11B 9/10    (2006.01)
    G11B 11/03   (2006.01)

(52) U.S. Cl.
    CPC ...... *G11C 11/5628* (2013.01); *G11C 11/5642* (2013.01); *G11C 11/5671* (2013.01); *G11B 9/10* (2013.01); *G11B 11/03* (2013.01)

(58) Field of Classification Search
    CPC ............ G11C 11/5628; G11C 11/5642; G11C 11/5671; G11B 11/03; G11B 9/10
    USPC ..................................................... 365/189.11
    See application file for complete search history.

(56) References Cited

U.S. PATENT DOCUMENTS

| 4,748,592 | A  | 5/1988  | Nagao et al.    |
| 5,402,410 | A  | 3/1995  | Yoshimura et al.|
| 6,300,622 | B1 | 10/2001 | Menzel          |
| 2002/0144892 | A1 | 10/2002 | Lee et al.   |
| 2003/0058749 | A1 | 3/2003  | Yoo et al.   |
| 2003/0081532 | A1 | 5/2003  | Gibson       |
| 2003/0133252 | A1 | 7/2003  | Fasen        |
| 2004/0213127 | A1 | 10/2004 | Birecki et al.|
| 2006/0072428 | A1 | 4/2006  | Marshall et al.|

(Continued)

FOREIGN PATENT DOCUMENTS

| CN | 1164293 A | 11/1997 |
| CN | 1409311 A | 4/2003  |

(Continued)

*Primary Examiner* — Ly D Pham
(74) *Attorney, Agent, or Firm* — Conley Rose, P.C.

(57) ABSTRACT

A data writing and reading method is applied to a data storage system. The storage system includes a processor, a charged particle beam excitation modulation component, and a recording medium. The method is performed by the processor. The data writing method includes obtaining to-be-written data; controlling, based on the to-be-written data, the charged particle beam excitation modulation component to generate a charged particle beam array with a target modulation feature; and controlling the charged particle beams in the charged particle beam array to act on the recording medium to generate, in a target area of the recording medium, a target recording feature corresponding to the to-be-written data.

20 Claims, 16 Drawing Sheets

(56) References Cited

U.S. PATENT DOCUMENTS

| | | | |
|---|---|---|---|
| 2006/0087953 | A1 | 4/2006 | Tohyama et al. |
| 2006/0286337 | A1 | 12/2006 | Marshall et al. |
| 2009/0059773 | A1 | 3/2009 | Obara et al. |
| 2018/0144905 | A1 | 5/2018 | Iizuka et al. |
| 2023/0051086 | A1 | 2/2023 | Zheng et al. |

FOREIGN PATENT DOCUMENTS

| | | | |
|---|---|---|---|
| CN | 1417782 | A | 5/2003 |
| CN | 1433133 | A | 7/2003 |
| CN | 1571047 | A | 1/2005 |
| CN | 1776413 | A | 5/2006 |
| CN | 101432812 | A | 5/2009 |
| CN | 101443847 | A | 5/2009 |
| CN | 111508535 | A | 8/2020 |
| JP | H0536128 | A | 2/1993 |
| JP | 2000509181 | A | 7/2000 |
| JP | 2008541319 | A | 11/2008 |

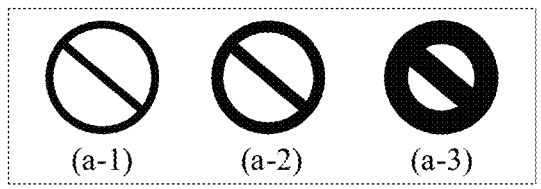
(a-1)   (a-2)   (a-3)
FIG. 9A
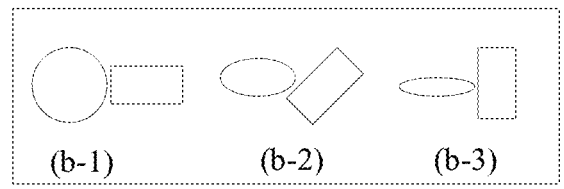
(b-1)   (b-2)   (b-3)
FIG. 9B
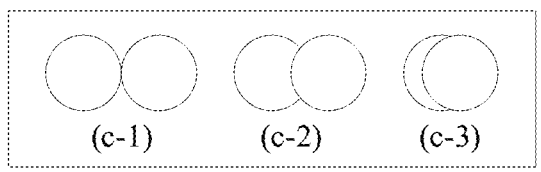
(c-1)   (c-2)   (c-3)
FIG. 9C
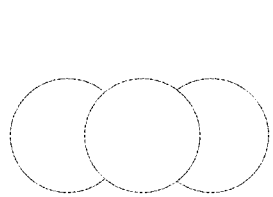   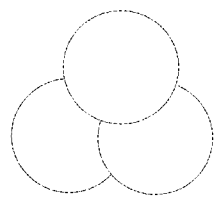   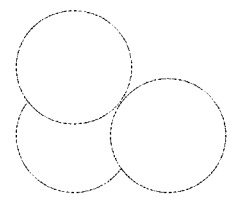
FIG. 10A      FIG. 10B      FIG. 10C
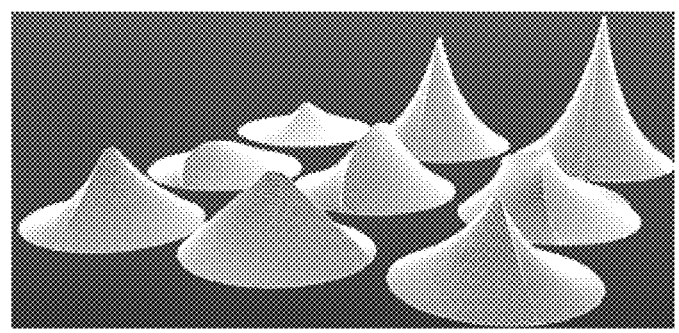
FIG. 11

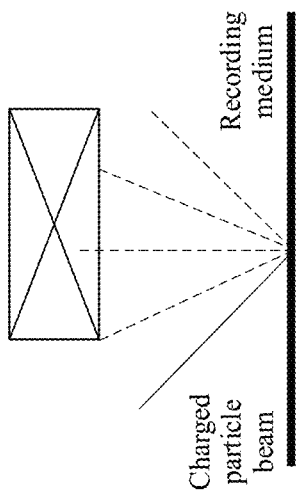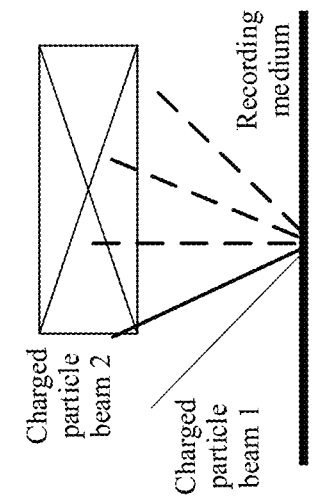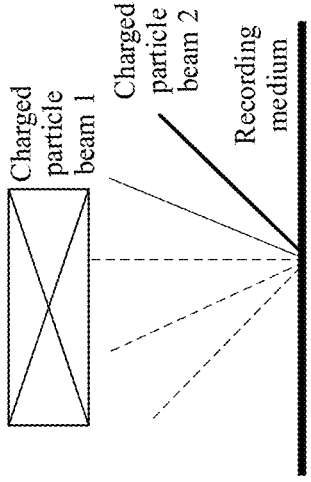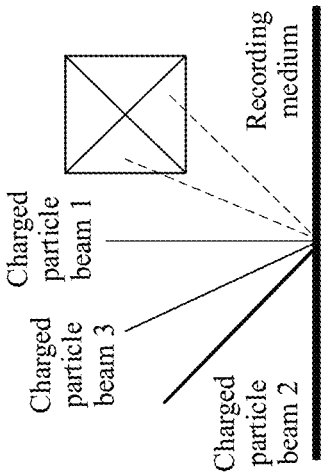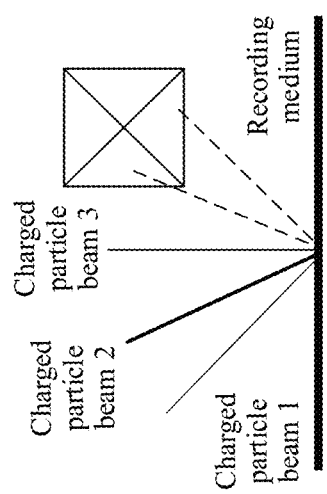

DATA WRITING AND READING METHOD AND APPARATUS, AND SYSTEM

CROSS-REFERENCE TO RELATED APPLICATIONS

This is a continuation of International Patent Application No. PCT/CN2021/080267 filed on Mar. 11, 2021, which claims priority to Chinese Patent Application No. 202010176209.9 filed on Mar. 13, 2020. The disclosures of the aforementioned applications are hereby incorporated by reference in their entireties.

TECHNICAL FIELD

This disclosure relates to the storage field, and in particular, to a data writing and reading method and apparatus, and a system.

BACKGROUND

With development of information technologies, an amount of data to be stored increases dramatically. Data is usually stored on a magnetic disk or an optical disc.

When data is stored on the magnetic disk, a storage capacity of each magnetic disk is limited by a size of a magnetic storage unit in the magnetic disk. When data is stored on the optical disc, a storage capacity of each optical disc is limited by a light spot size. Therefore, it is difficult to further increase storage densities of the magnetic disk and the optical disc. In other words, it is difficult to further increase the storage capacity.

SUMMARY

This disclosure provides a data writing and reading method and apparatus, and a system, to increase a data storage density.

To achieve the objectives, this disclosure provides the following technical solutions.

According to a first aspect, this disclosure provides a data writing method, applied to a storage system. The storage system includes a processor, a charged particle beam excitation modulation component, and a recording medium. The method is performed by the processor. The method includes obtaining to-be-written data, controlling, based on the to-be-written data, the charged particle beam excitation modulation component to generate a charged particle beam array with a target modulation feature, where the charged particle beam array includes one or more charged particle beams, and then controlling the charged particle beams in the charged particle beam array to act on the recording medium, to generate, in a target area of the recording medium, a target recording feature corresponding to the to-be-written data. The target area is an area in which the charged particle beams in the charged particle beam array reacts with the recording medium.

In the method, the charged particle beam acts on the recording medium, to generate, in the acted target area, a recording feature corresponding to the to-be-written data, implementing data writing. Because a spot size of the charged particle beam may be controlled below 10 nanometers (nm), compared with an existing magnetic storage method and an existing optical storage method, the data writing method provided in this disclosure can increase a data storage capacity. In addition, the charged particle beam can be controlled only by modulating an electric field and a magnetic field, without introducing a problem such as complex optical path control and a precision machined lens in an optical storage system. Therefore, a simple system composition reduces an error in a read and write process, improves system reliability, and further reduces costs.

With reference to the first aspect, in a possible design manner, controlling, based on the to-be-written data, the charged particle beam excitation modulation component to generate a charged particle beam array with a target modulation feature includes controlling, based on the to-be-written data and a predetermined mapping relationship, the charged particle beam excitation modulation component to generate the charged particle beam array with the target modulation feature. The mapping relationship defines a correspondence between data to be written and a modulation feature of the charged particle beam array. The charged particle beam array with the modulation feature is used to generate, on the recording medium, a recording feature corresponding to the data to be written. The recording feature includes a spatial profile feature and at least either of a physical feature and a chemical feature. In this possible design, the charged particle beam array with the target modulation feature is generated, to generate, on the recording medium, the target recording feature corresponding to the to-be-written data, implementing data writing.

With reference to the first aspect, in another possible design manner, controlling the charged particle beams in the charged particle beam array to act on the recording medium, to generate, in a target area of the recording medium, a target recording feature corresponding to the to-be-written data includes controlling the charged particle beams in the charged particle beam array to act on an auxiliary material layer on the recording medium, to generate, on the auxiliary material layer on the recording medium, an auxiliary feature corresponding to the to-be-written data. The auxiliary feature corresponding to the to-be-written data generated on the auxiliary material layer is used to generate, in the target area of the recording medium, the target recording feature corresponding to the to-be-written data. The auxiliary material layer includes one or more layers. In this possible design, the auxiliary feature generated under action of the charged particle beam on the auxiliary material layer is transferred to the recording medium. In this case, the target recording feature corresponding to the to-be-written data is generated on the recording medium, implementing data writing.

With reference to the first aspect, in another possible design manner, the storage system further includes a scan control component. The scan control component is configured to control, based on a preset scan path, the charged particle beam array to act on the recording medium. Controlling the charged particle beams in the charged particle beam array to act on the recording medium includes controlling the scan control component based on the preset scan path, to control the charged particle beam array to act on the target area.

With reference to the first aspect, in another possible design manner, the recording feature includes the spatial profile feature. The spatial profile feature includes a circular spatial profile feature, and circular spatial profile features of different diameters are in a one-to-one correspondence with the data to be written.

Alternatively, the recording feature includes the spatial profile feature. The spatial profile feature includes an elliptical spatial profile feature, and elliptical spatial profile features of different sizes are in a one-to-one correspondence with the data to be written.

Alternatively, the recording feature includes at least either of the physical feature and the chemical feature, and the spatial profile feature. The spatial profile feature includes a circular spatial profile feature, the physical feature includes a physical feature in the circular spatial profile feature of the recording medium, and the chemical feature includes a chemical feature in the circular spatial profile feature of the recording medium. Circular spatial profile features of different diameters that include at least either of the physical feature and the chemical feature are in a one-to-one correspondence with the data to be written.

Alternatively, the recording feature includes at least either of the physical feature and the chemical feature, and the spatial profile feature. The spatial profile feature includes an elliptical spatial profile feature, the physical feature includes a physical feature in the elliptical spatial profile feature of the recording medium, and the chemical feature includes a chemical feature in the elliptical spatial profile feature of the recording medium. Elliptical spatial profile features of different sizes that include at least either of the physical feature and the chemical feature are in a one-to-one correspondence with the data to be written.

With reference to the first aspect, in another possible design manner, the storage system further includes a critical state excitation component, and the method further includes controlling the critical state excitation component to process a to-be-reacted area of the recording medium, to allow the to-be-reacted area to be in at least one of a spatial profile change critical state, a physical feature change critical state, or a chemical feature change critical state. The to-be-reacted area includes the target area. Controlling the charged particle beams in the charged particle beam array to act on the recording medium includes controlling the charged particle beam array to act on the target area that is processed by the critical state excitation component.

In this way, it is easier to generate the target recording feature corresponding to the to-be-written data in the target area when the charged particle beam array with the target modulation feature that is controlled to be generated by the charged particle beam excitation modulation component acts on the target area, compared with when the charged particle beam array acts on a target area that is not in the spatial profile change critical state, the physical feature change critical state, or the chemical feature change critical state. Therefore, data writing efficiency is effectively improved.

With reference to the first aspect, in another possible design manner, controlling the critical state excitation component to process a to-be-reacted area of the recording medium includes processing the to-be-reacted area of the recording medium by using at least one of heat, a laser, ultrasound, an ion beam, a plasma, or gas generated by the critical state excitation component. The gas is gas that allows the recording medium to improve physical or chemical activity.

With reference to the first aspect, in another possible design manner, the charged particle includes at least one of an electron, an ion, and a plasma.

With reference to the first aspect, in another possible design manner, the target modulation feature includes at least one of a shape, a spatial energy distribution, a temporal energy distribution, or a spatial action angle of the charged particle beam in the charged particle beam array.

According to a second aspect, this disclosure provides a data reading method, applied to a storage system. The storage system includes a processor, a charged particle beam excitation modulation component, and a recording medium. The recording medium is configured to store to-be-read data. The method is performed by the processor. The method includes obtaining a read request, where the read request is used to request to read the to-be-read data, controlling, based on the read request, the charged particle beam excitation modulation component to generate a charged particle beam array with a target modulation feature, where the charged particle beam array includes one or more charged particle beams, controlling the charged particle beams in the charged particle beam array to act on a reacting area of the recording medium, to determine a target recording feature of a target area, where the reacting area includes the target area, the target recording feature includes a spatial profile feature and at least either of a physical feature and a chemical feature, and the to-be-read data is corresponding to the target recording feature, and reading, based on the determined target recording feature, the to-be-read data.

With reference to the second aspect, in a possible design manner, the storage system further includes a charged particle beam imaging component. Determining a target recording feature of a target area includes controlling the charged particle beam imaging component to obtain a charged particle image obtained by acting on the charged particle beams in the charged particle beam array on the target area, and determining, based on the obtained charged particle image, the target recording feature of the target area.

With reference to the second aspect, in another possible design manner, when the charged particle beam array acts on the target area, the target recording feature of the target area is not changed or damaged.

With reference to the second aspect, in another possible design manner, the storage system further includes a scan control component. The scan control component is configured to control, based on a preset scan path, the charged particle beam array to act on the recording medium. Controlling the charged particle beams in the charged particle beam array to act on a reacting area of the recording medium includes controlling the scan control component based on the preset scan path, to control the charged particle beam array to act on the reacting area of the recording medium.

With reference to the second aspect, in another possible design manner, the recording feature includes the spatial profile feature. The spatial profile feature includes a circular spatial profile feature, and circular spatial profile features of different diameters are in a one-to-one correspondence with the data to be read.

Alternatively, the recording feature includes the spatial profile feature. The spatial profile feature includes an elliptical spatial profile feature, and elliptical spatial profile features of different sizes are in a one-to-one correspondence with the data to be read.

Alternatively, the recording feature includes at least either of the physical feature and the chemical feature, and the spatial profile feature. The spatial profile feature includes a circular spatial profile feature, the physical feature includes a physical feature in the circular spatial profile feature of the recording medium, and the chemical feature includes a chemical feature in the circular spatial profile feature of the recording medium. Circular spatial profile features of different diameters that include at least either of the physical feature and the chemical feature are in a one-to-one correspondence with the data to be read.

Alternatively, the recording feature includes at least either of the physical feature and the chemical feature, and the spatial profile feature. The spatial profile feature includes an elliptical spatial profile feature, the physical feature includes a physical feature in the elliptical spatial profile feature of the recording medium, and the chemical feature includes a chemical feature in the elliptical spatial profile feature of the recording medium. Elliptical spatial profile features of different sizes that include at least either of the physical feature and the chemical feature are in a one-to-one correspondence with the data to be read.

With reference to the second aspect, in another possible design manner, the charged particle includes at least one of an electron, an ion, and a plasma.

With reference to the second aspect, in another possible design manner, the target modulation feature includes at least one of a shape, a spatial energy distribution, a temporal energy distribution, or a spatial action angle of the charged particle beam in the charged particle beam array.

It may be understood that for beneficial effects of the technical solution provided in the second aspect or corresponding possible designs of the second aspect, refer to the descriptions of the technical solution provided in the first aspect or corresponding possible designs of the first aspect. Details are not described herein again.

According to a third aspect, this disclosure provides a data writing apparatus. The apparatus is used in a storage system. The storage system further includes a charged particle beam excitation modulation component and a recording medium.

In a possible design, the apparatus may be configured to perform any method provided in the first aspect. In this disclosure, the apparatus may be divided into functional components according to any method provided in the first aspect. For example, each functional component may be obtained through division based on a corresponding function, or two or more functions may be integrated into one processing component. For example, in this disclosure, the apparatus may be divided into an obtaining unit, a control unit, and the like based on functions. For descriptions of possible technical solutions performed by the foregoing functional components obtained through division and beneficial effects, refer to the technical solutions provided in the first aspect or corresponding possible designs of the first aspect. Details are not described herein again.

In another possible design, the apparatus includes a memory and one or more processors. The memory is configured to store computer instructions, and the processor is configured to invoke the computer instructions to perform the method according to any one of the first aspect and the possible design manners of the first aspect.

According to a fourth aspect, this disclosure provides a data reading apparatus. The apparatus is used in a storage system. The storage system further includes a charged particle beam excitation modulation component and a recording medium. The recording medium is configured to store to-be-read data.

In a possible design, the apparatus may be configured to perform any method provided in the second aspect. In this disclosure, the apparatus may be divided into functional components according to any method provided in the second aspect. For example, each functional component may be obtained through division based on a corresponding function, or two or more functions may be integrated into one processing component. For example, in this disclosure, the apparatus may be divided into an obtaining unit, a control unit, a reading unit, and the like based on functions. For descriptions of possible technical solutions performed by the foregoing functional components obtained through division and beneficial effects, refer to the technical solutions provided in the second aspect or corresponding possible designs of the first aspect. Details are not described herein again.

In another possible design, the apparatus includes a memory and one or more processors. The memory is configured to store computer instructions, and the processor is configured to invoke the computer instructions to perform the method according to any one of the second aspect and the possible design manners of the second aspect.

According to a fifth aspect, this disclosure provides a data storage system. The system includes a processor, a charged particle beam excitation modulation component, and a recording medium. The charged particle beam excitation modulation component is coupled to the processor. The processor may write data into the recording medium by performing any method provided in the first aspect and any one of the possible design manners of the first aspect. Alternatively, the processor may read data from the recording medium by performing any method provided in the second aspect and any one of the possible design manners of the second aspect.

According to a sixth aspect, this disclosure provides a computer-readable storage medium, for example, a non-transient computer-readable storage medium. The computer-readable storage medium stores a computer program (or instructions). When the computer program (or instruction) is run on a computer, the computer is enabled to perform any method provided in any one of the possible implementations according to the first aspect.

According to a seventh aspect, this disclosure provides a computer-readable storage medium, for example, a non-transient computer-readable storage medium. The computer-readable storage medium stores a computer program (or instructions). When the computer program (or the instructions) is/are run on a computer, the computer is enabled to perform any method according to any one of the possible implementations of the second aspect.

According to an eighth aspect, this disclosure provides a computer program product. When the computer program product runs on a computer, any method according to any one of the possible implementations of the first aspect is performed.

According to a ninth aspect, this disclosure provides a computer program product. When the computer program product runs on a computer, any method provided in any possible implementation of the second aspect is performed.

According to a tenth aspect, this disclosure provides a chip system. The chip system is applied to a data writing apparatus, and the chip system includes one or more interface circuits and one or more processors. The interface circuit and the processor are interconnected through a line. The interface circuit is configured to receive a signal from a memory of the data writing apparatus, and send the signal to the processor. The signal includes computer instructions stored in the memory. When the processor executes the computer instructions, the data writing apparatus performs any method provided in any possible implementation of the first aspect.

According to an eleventh aspect, this disclosure provides a chip system. The chip system is applied to a data reading apparatus, and the chip system includes one or more interface circuits and one or more processors. The interface circuit and the processor are interconnected through a line. The interface circuit is configured to receive a signal from a memory of the data reading apparatus, and send the signal to the processor. The signal includes computer instructions stored in the memory. When the processor executes the computer instructions, the data reading apparatus performs any method provided in any possible implementation of the second aspect.

It may be understood that any one of the apparatus, the computer storage medium, the computer program product, the chip system, or the like provided above may be applied to a corresponding method provided above. Therefore, for beneficial effects that can be achieved by the apparatus, the computer storage medium, the computer program product, the chip system, or the like, refer to the beneficial effects of the corresponding method. Details are not described herein again.

In this disclosure, names of the data writing apparatus and the data reading apparatus do not constitute any limitation to devices or functional components. In an actual implementation, these devices or functional components may have other names. Each device or functional component falls within the scope defined by the claims and their equivalent technologies in this disclosure, provided that a function of the device or functional module is similar to that described in this disclosure.

BRIEF DESCRIPTION OF DRAWINGS

FIG. 9A, FIG. 9B, and FIG. 9C are schematic diagrams of a modulation feature of a charged particle beam according to an embodiment of this disclosure;

FIG. 10A, FIG. 10B, and FIG. 10C are schematic diagrams of a modulation feature of a charged particle beam according to an embodiment of this disclosure;

FIG. 11 is a schematic diagram of a modulation feature of a charged particle beam according to an embodiment of this disclosure;

FIG. 17A, FIG. 17B, FIG. 17C, FIG. 17D, FIG. 17E, and FIG. 17F are schematic diagrams of a modulation feature of a charged particle beam according to an embodiment of this disclosure;

DESCRIPTION OF EMBODIMENTS

In addition, in embodiments of this disclosure, the word "example" or "for example" is used to represent giving an example, an illustration, or a description. Any embodiment or design scheme described as an "example" or "for example" in embodiments of this disclosure should not be explained as being more preferred or having more advantages than another embodiment or design scheme. Exactly, use of the word "example" or "for example" is intended to present a related concept in a specific manner.

In the descriptions of this disclosure, unless otherwise stated, "a plurality of" means two or more than two.

Embodiments of this disclosure provide a data writing and reading method, applied to a data storage system. In this method, a charged particle beam array with a target modulation feature acts on a recording medium, to generate, on the recording medium, a target recording feature corresponding to to-be-written data, implementing data writing. A charged particle includes at least one of an electron, an ion, and a plasma. The target recording feature of the recording medium includes a spatial profile feature and at least either of a physical feature and a chemical feature. A modulation feature of the charged particle beam includes at least one of a shape, a spatial energy distribution, a temporal energy distribution, or a spatial action angle of the charged particle beam.

Correspondingly, a charged particle beam that does not change the target recording feature of the recording medium acts on a recording medium with recorded data, to determine a target recording feature of the recording medium with the recorded data. Then to-be-read data is read based on the determined target recording feature of the recording medium with the recorded data.

Because a spot size of the charged particle beam acted on the recording medium may be controlled below 10 nm, data storage performed by using the data writing method provided in embodiments of this disclosure has a high storage density and a large storage capacity.

It may be understood that "the charged particle beam acts on the recording medium" in this embodiment of this disclosure may be that the charged particle beam irradiates, or casts, or bombards on the recording medium, or the like. This is not limited.

Figure 1:
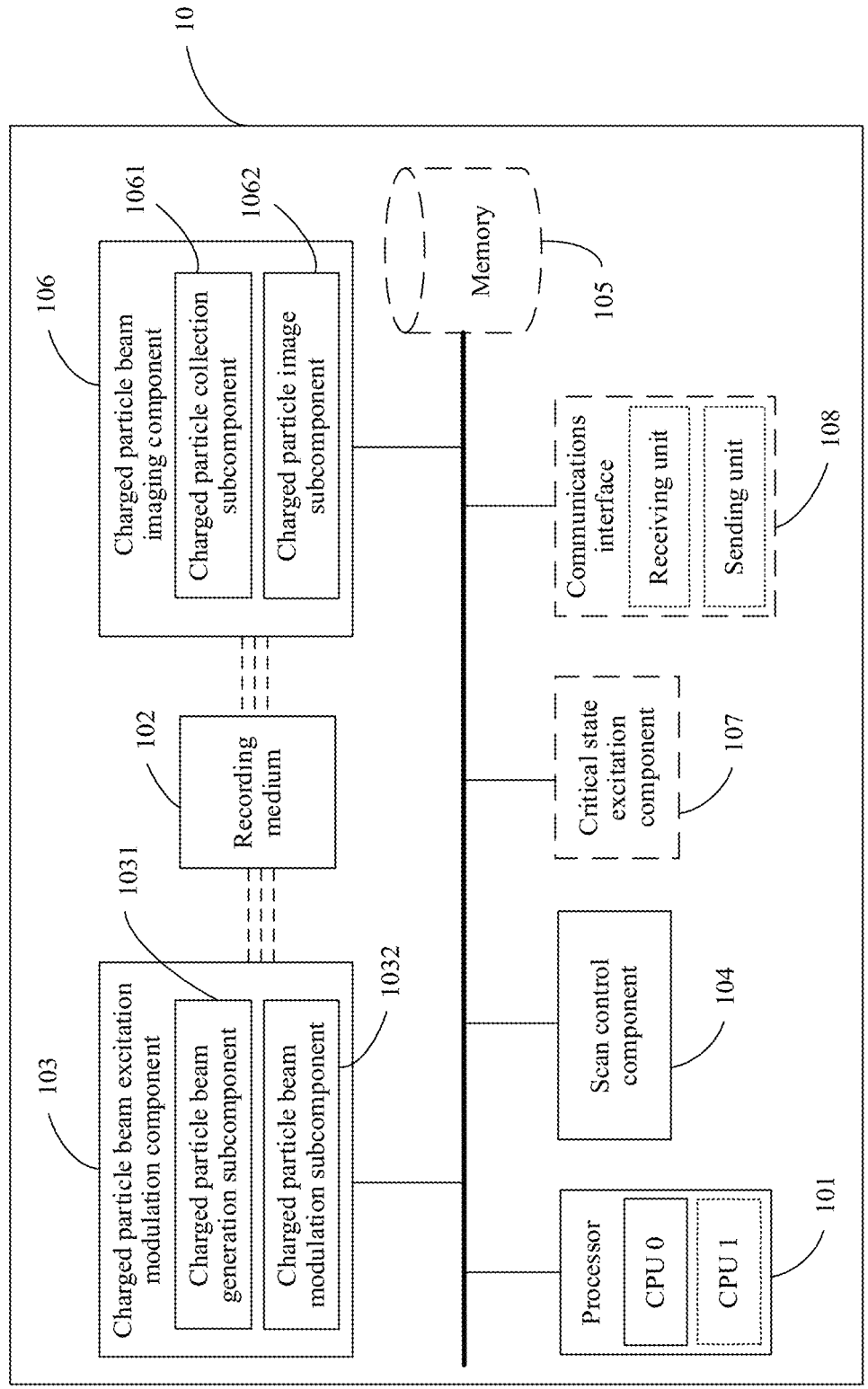
FIG. 1 is a schematic diagram of a structure of a storage system according to an embodiment of this disclosure.

Refer to FIG. 1. FIG. 1 shows a storage system 10 according to an embodiment of this disclosure. The data writing and reading method may be applied to the storage system 10. As shown in FIG. 1, the storage system 10 may include a processor 101, a recording medium 102, a charged particle beam excitation modulation component 103, a scan control component 104, a memory 105, and a charged particle beam imaging component 106. The charged particle beam excitation modulation component 103, the scan control component 104, the memory 105, and the charged particle beam imaging component 106 separately communicate with the processor 101.

Optionally, the storage system 10 may further include a critical state excitation component 107 and a communications interface 108. The critical state excitation component 107 and the communications interface 108 separately communicate with the processor 101.

It may be understood that the components may be disposed in one device, or may be integrated into different devices. This is not limited.

The processor 101 is a control center of the storage system 10, and may be a general-purpose central processing unit (CPU), another general-purpose processor, or the like. The general-purpose processor may be a microprocessor, any conventional processor, or the like.

For example, the processor 101 may include one or more CPUs, for example, a CPU 0 and a CPU 1 that are shown in FIG. 1.

The recording medium 102 is a carrier used to record data in the storage system 10.

The recording medium 102 may be of a basic shape. The basic shape includes a circular disk, a cylinder, a cone, a sphere, a polygonal disk, a polyhedron, or the like. The polygonal disk may be a triangular disk, a rectangular disk, or the like. The polyhedron may be a polygonal cone or a polygonal column. The polygonal cone may be a triangular cone, a quadrangular cone, or the like. The polygonal column may be a triangular prism, a quadrangular prism, or the like. The quadrangular prism may be a cube, a cuboid, or the like. Alternatively, the polyhedron may be a polyhedron of any shape, for example, a space folded shape. Certainly, the polyhedron is not limited thereto. In addition, a shape of the recording medium 102 may also be a variant or combination of basic shapes, for example, a multilayer disk, a space tetrahedron ring, or a space folded shape. The multilayer disk herein may be a multilayer circular disk, a multilayer rectangular disk, or the like, which is certainly not limited thereto.

Figure 2A:
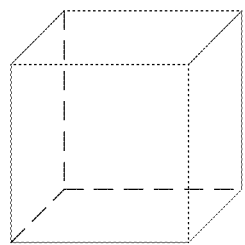
FIG. 2A, FIG. 2B, FIG. 2C, FIG. 2D, FIG. 2E, FIG. 2F, and FIG. 2G are schematic diagrams of a form of a recording medium according to an embodiment of this disclosure.
Figure 2B:
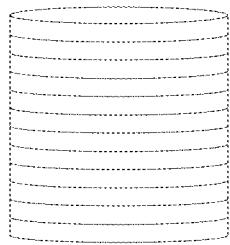
Figure 2C:
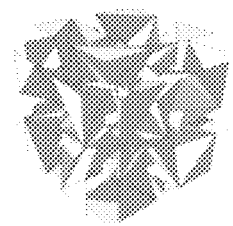
Figure 2D:
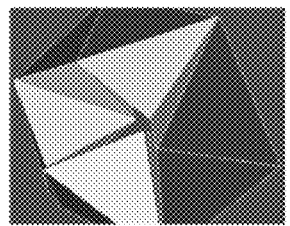
Figure 2E:
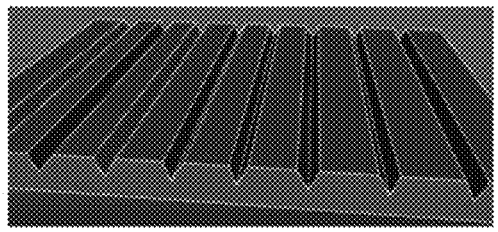

Refer to FIGS. 2A-2G. FIGS. 2A-2E show examples of several shapes of the recording medium 102. FIG. 2A shows a cube. FIG. 2B shows a multilayer disk. FIG. 2C shows a space folded body. FIG. 2D shows a space tetrahedron. FIG. 2E shows a recording medium with a sawtooth-shaped groove.

The recording medium 102 has good mechanical, thermal, optical, and chemical stability. For example, the recording medium 102 may be any one of basic materials such as glass, ceramic, a semiconductor material, and a composite material, or may be made by changing a micro-nano-structured basic material. In addition, a material generated by physical and chemical compounding between different basic materials may also be used as a recording medium material. For example, a material obtained through doping, layer-by-layer compounding (for example, a multilayer film), space embedding (for example, embedding a micro-nano structure, such as a nanosphere or a nanorod, in a matrix material), space cross-linking, or the like may also be used as the recording medium 102. For another example, one or more layers of auxiliary materials are added to or coated on the basic material to obtain a material, which may also be used as the recording medium 102.

Figure 2F:
Figure 2G:
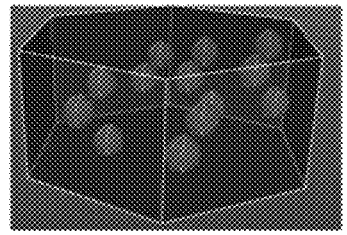

Refer to FIGS. 2A-2G. FIG. 2F and FIG. 2G show examples of two types of materials of the recording medium 102. FIG. 2F shows a porous material shaped like a pentagonal prism. FIG. 2G shows a basic material shaped like a pentagonal prism, in which another auxiliary spherical material is embedded. In this manner, energy absorption or deposition of a charged particle by the recording medium can be improved.

A surface of the recording medium 102 in a same plane may be usually divided into a plurality of partitions, and each partition is configured to store data. The data may be of a same type or different types, or may be of a same user or different users. This is not limited.

Figure 3:
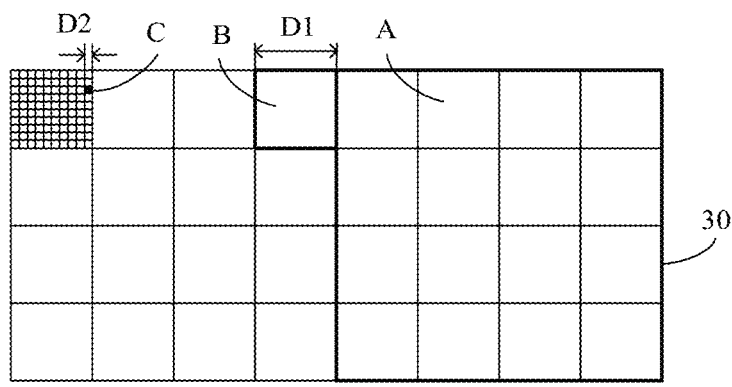
FIG. 3 is a schematic diagram of partitioning a recording medium according to an embodiment of this disclosure.

Refer to FIG. 3. FIG. 3 shows an example of a rectangular recording medium 30. The recording medium 30 may be divided into a plurality of large areas A. The large area A may be divided into a plurality of small areas B with the side length D1. The small area B may be further divided into a plurality of (for example, 100) micro areas C with the side length D2. Both D1 and D2 are values greater than 0. In an actual application, D1 may be micron-sized, and D2 may be nanometer-sized. For example, D1 may be 1 micron, and D2 may be 10 nanometers.

After charged particle beams with different modulation features act on the recording medium 102, a corresponding recording feature is generated on the recording medium 102. The recording feature of the recording medium 102 includes a spatial profile feature and at least either of a physical feature and a chemical feature of the recording medium. For specific descriptions of the recording feature of the recording medium 102, refer to the following description of the target recording feature. Details are not described herein again.

A charged particle beam excitation modulation component 103 includes a charged particle beam generation subcomponent 1031 and a charged particle beam modulation subcomponent 1032.

The charged particle beam generation subcomponent 1031 is configured to generate, based on an indication of a processor, an initial charged particle beam array.

The charged particle beam generation subcomponent 1031 may include at least one of a field excitation device, a thermal excitation device, or a light excitation device. The field excitation device may be a high-voltage control circuit. The thermal excitation device may be a heating apparatus (for example, a contact heating device or a radiant heating device). The light excitation device may be a laser source (for example, a femtosecond laser source).

The charged particle beam generation subcomponent 1031 may further include one or more excitation media. The excitation medium may be of tungsten (W), lanthanum hexaboride (LaB$_6$), or tungsten coated zirconia (ZrO/W). This embodiment of this disclosure is not limited thereto. If the charged particle beam generation subcomponent 1031 includes a plurality of excitation media. The plurality of excitation media may be of a same material, or may be of different materials. This is not limited in this embodiment of this disclosure.

Further, for example, the field excitation device is a high-voltage control circuit. The high-voltage control circuit may apply, according to an indication of the processor 101, a specific continuous or pulse voltage to each excitation medium, to excite the excitation medium to generate a continuous or pulse charged particle beam. Energy and a current density of the charged particle beam may be related to at least one of a magnitude, a time period, a frequency, a pulse width, or a pulse interval of the voltage applied by the high-voltage control circuit to the excitation medium.

For example, the heat excitation device is a heating apparatus. The heating apparatus may, according to an indication of the processor 101, continuously heat each excitation medium to a specific temperature or heat each excitation medium to a specific temperature with a heat pulse, to excite the excitation medium to generate a continuous or pulse charged particle beam. Energy and a current density of the charged particle beam may be related to at least one of a temperature, a time period, a pulse frequency, a pulse width, or a pulse interval at which the excitation medium is heated by the heating apparatus.

For example, the light excitation device is a laser source. The light excitation device may irradiate, according to an indication of the processor 101, each excitation medium with a continuous or pulse laser, to excite the excitation medium to generate a continuous or pulsed charged particle beam. Energy and a current density of the charged particle beam may be related to at least one of an energy density, a wavelength, a reaction time period, a pulse frequency, a pulse width, or a pulse interval of the laser emitted by the laser source.

The charged particle beam modulation subcomponent 1032 is configured to modulate the initial charged particle beam array generated by the charged particle beam generation subcomponent 1031, to obtain the charged particle beam array used to act on the recording medium 102. The charged particle beam modulation subcomponent 1032 may include a charged particle beam modulation device such as a limiting aperture, a charged particle beam splitter, a charged particle acceleration and deceleration device, a focusing device, an electrical deflector, or a magnetic deflector. The charged particle beam modulation device sets, based on a control parameter determined by the processor 101, a modulation parameter, and modulates the charged particle beam array generated by the charged particle beam generation subcomponent 1031, to obtain a charged particle beam array that has a specific shape, a spatial energy distribution, a temporal energy distribution, or a spatial action angle.

The charged particle beam modulation subcomponent 1032 includes a primary modulation device and a secondary modulation device. The primary modulation device is configured to modulate the charged particle beam array generated by the charged particle beam generation subcomponent 1031 into a charged particle beam array having a fixed size and an initial shape. The initial shape herein may be a circle, a rectangle, or the like. This is not limited in embodiments of this disclosure. The secondary modulation device is configured to further modulate the charged particle beam arrays modulated by the primary modulation device, to obtain charged particle beam arrays that have different shapes, spatial energy distributions, temporal energy distributions, or spatial action angles.

A modulation method of the primary modulation device may be at least one of shape modulation, charged particle beam splitting, acceleration and deceleration, focusing, deflection, collimation, phase dissipation, phase aberration, or the like. A modulation method of the secondary modulation device may be at least one of shape modulation, charged particle beam splitting, acceleration and deceleration, focusing, deflection, collimation, phase dissipation, phase aberration, or the like. Certainly, this is not limited thereto. Further, for modulation of a shape, a spatial energy distribution, a temporal energy distribution, or a spatial action angle of the charged particle beam array by using the modulation method, refer to the following description of a modulation feature of the charged particle beam. Details are not described herein again.

A scan control component 104 includes a charged particle beam position control subcomponent and a recording medium position control subcomponent. The scan control component 104 receives indication information of the processor 101, and translates or deflects, based on the indication information, the charged particle beam array. Alternatively, the scan control component 104 translates or rotates, based on the indication information, a position of the recording medium, to move a reacting position of the charged particle beam array on the recording medium. Relative motion between the charged particle beam array and the recording medium is controlled, so that the charged particle beam array acts on different positions of the recording medium. In embodiments of this disclosure, a trajectory formed when the charged particle beam array acts on the different reacting positions of the recording medium is referred to as a scan path.

Figure 4A:
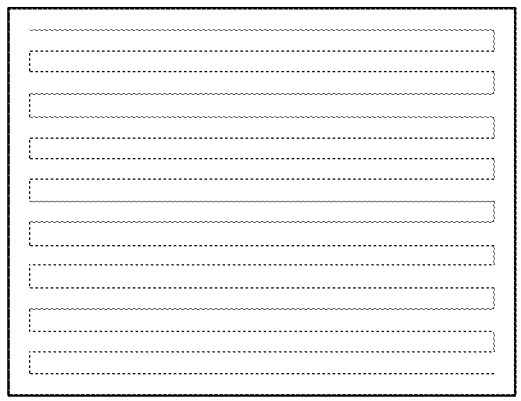
FIG. 4A, FIG. 4B, FIG. 4C, FIG. 4D, FIG. 4E, and FIG. 4F are schematic diagrams of a scan path of a charged particle according to an embodiment of this disclosure.
Figure 4B:
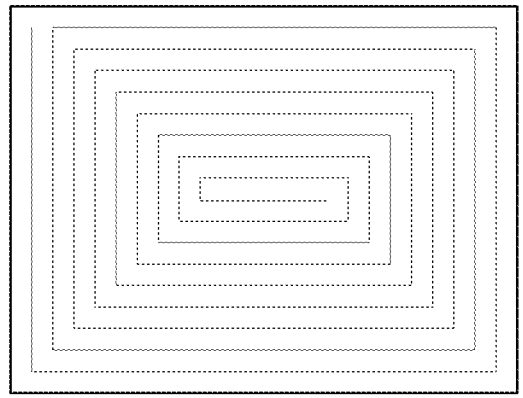
Figure 4C:
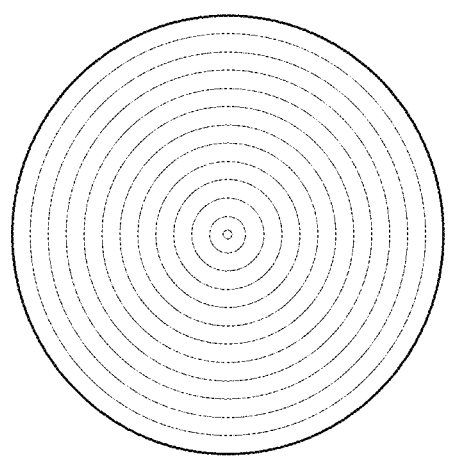
Figure 4D:
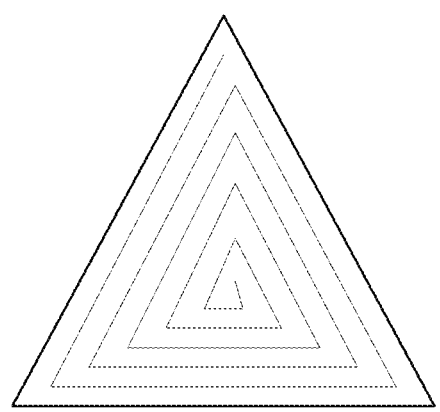
Figure 4E:
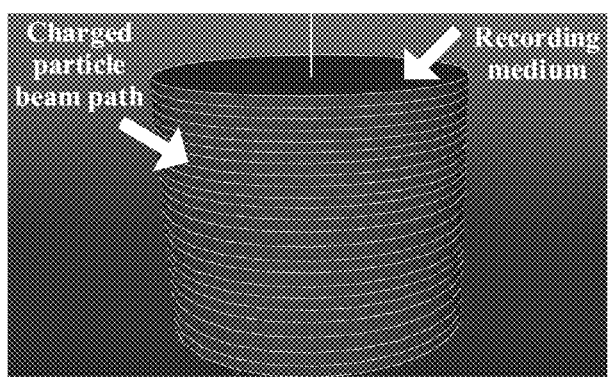
Figure 4F:
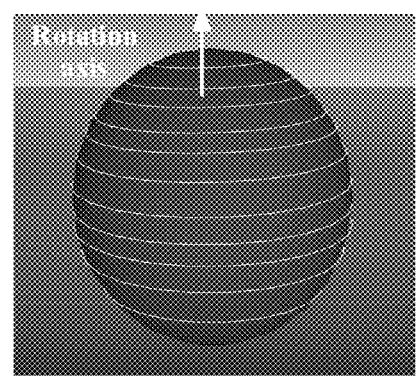

Refer to FIGS. 4A-4F. FIGS. 4A-4F show examples of several scan paths. FIGS. 4A-4D separately show a scan path of a charged particle beam array on a planar recording medium. FIG. 4A shows a scan path of the charged particle beam array on a recording medium with a rectangular surface. FIG. 4B shows another scan path of a charged particle beam array on a recording medium with a rectangular surface. FIG. 4C shows a scan path of a charged particle beam array on a recording medium with a circular surface. FIG. 4D shows a scan path of a charged particle beam array on a recording medium with a triangular surface. FIG. 4E and FIG. 4F separately show a scan path of a charged particle beam array on a three-dimensional recording medium. FIG. 4E shows a scan path of a charged particle beam array on a cylindrical recording medium. FIG. 4F shows a scan path of a charged particle beam array on a spherical recording medium.

Figure 5A:
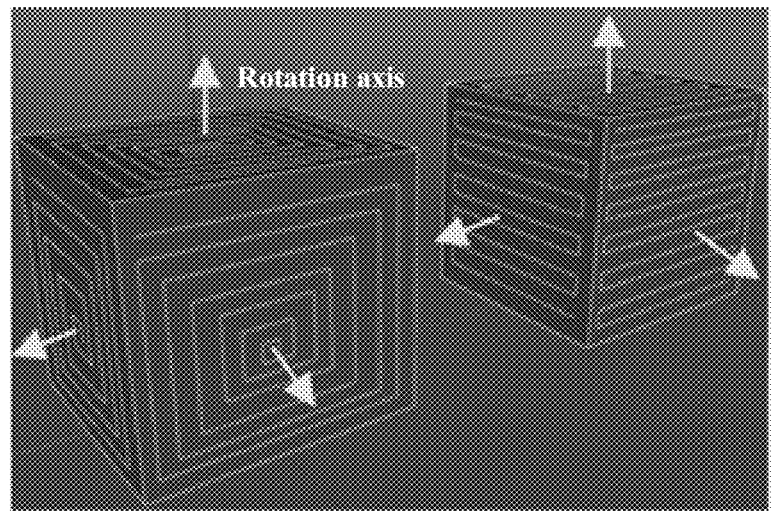
FIG. 5A and FIG. 5B are schematic diagrams of a scan path of a charged particle according to an embodiment of this disclosure.
Figure 5B:
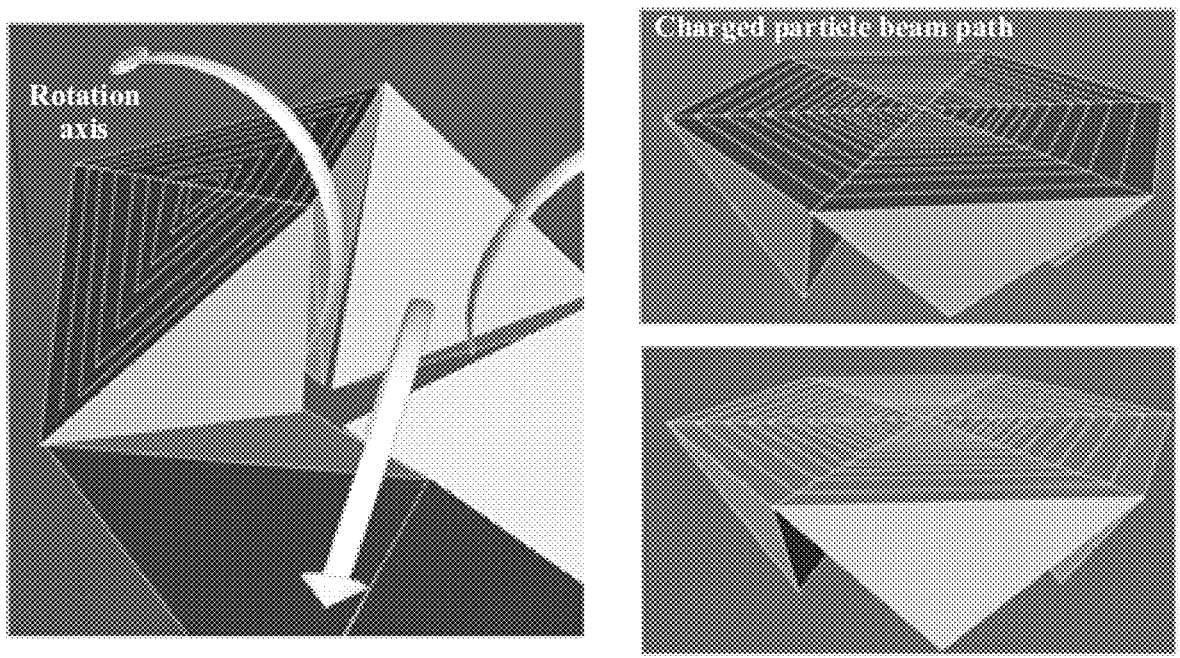

Refer to FIGS. 5A-5B. FIGS. 5A-5B shows examples of scan paths of a charged particle beam array on polyhedral recording mediums. The recording medium position control subcomponent controls rotation of the recording medium, so that the charged particle beam array can act on any surface of the recording medium. As shown in FIG. 5A, a scan control component 104 controls a rotation axis of a cube, so that a charged particle beam array can act on any surface of the cube in any scan path shown in FIGS. 4A-4F. As shown in FIG. 5B, the scan control component 104 controls a rotation axis of a polyhedron, so that a charged particle beam array can act on any surface of the polyhedron in any scan path shown in FIGS. 4A-4F.

The memory 105 may be a read-only memory (ROM) or another type of static storage device capable of storing static information and instructions, a random-access memory (RAM) or another type of dynamic storage device capable of storing information and instructions, an electrically erasable programmable ROM (EEPROM), a magnetic disk storage medium, the storage system provided in embodiments of this disclosure, or another magnetic storage device, or any other medium capable of carrying or storing expected program code in a form of an instruction or data structure and capable of being accessed by a computer, but is not limited thereto.

In a possible implementation, the memory 105 may be independent of a processor 101. The memory 105 may be connected to the processor 101 through a bus, and is configured to store data, instructions, or program code. When the processor 101 invokes and executes the instructions or the program code stored in the memory 105, the processor 101 may implement the data writing and reading method provided in embodiments of this disclosure.

In another possible implementation, the memory 105 may alternatively be integrated with the processor 101.

A charged particle beam imaging component 106 is configured to obtain a charged particle image obtained by acting on the charged particle beam array on the recording medium 102. The charged particle beam imaging component 106 includes a charged particle collection subcomponent 1061 and a charged particle image subcomponent 1062.

The charged particle collection subcomponent 1061 includes at least one of a reflected charged particle collection device, a scattered charged particle collection device, a transmitted charged particle collection device, a diffractive charged particle collection device, or a refracted charged particle collection device. The charged particle collection subcomponent 1061 is configured to collect at least one of a reflected charged particle, a scattered charged particle, a transmitted charged particle, a diffractive charged particle, or a refracted charged particle that is obtained by acting on the charged particle beam array on the recording medium 102.

The charged particle image subcomponent 1062 includes at least one of a reflected charged particle image device, a scattered charged particle image device, a transmitted charged particle image device, a diffractive charged particle image device, or a refracted charged particle image device. The charged particle image subcomponent 1062 is configured to obtain, based on the charged particle collected by the charged particle collection subcomponent 1061, at least one of a reflected charged particle image, a scattered charged particle image, a transmitted charged particle image, a diffractive charged particle image, or a refracted charged particle image. Further, the processor 101 may determine, according to the at least one charged particle image obtained by the charged particle image subcomponent 1062, a recording feature of the recording medium with recorded data.

A critical state excitation component 107 is configured to allow the recording feature of the recording medium 102 to be in a change critical state, to improve efficiency of changing the recording feature on the recording medium after the charged particle beam acts on the recording medium 102. The critical state excitation component 107 includes at least one of a heat generation device, a laser generation device, an ultrasonic generation device, an ion beam generation device, a plasma generation device, or a gas generation device. The critical state excitation component 107 communicates with the processor 101, and receives indication information from the processor 101.

A communications interface 108 is configured to connect the storage system 10 to another device (such as a server end and a client) by using a communications network. The communications network may be the Ethernet, a radio access network RAN), a wireless local area network (WLAN), or the like. The communications interface 108 may include a receiving unit configured to receive data and a sending unit configured to send data.

It should be noted that the structure shown in FIG. 1 does not constitute a limitation on the storage system 10. In addition to the components shown in FIG. 1, the storage system 10 may include more or fewer components than those shown in the figure, or have some components combined, or have different component arrangements.

The following describes the method provided in this embodiment of this disclosure with reference to the accompanying drawings.

Figure 6:
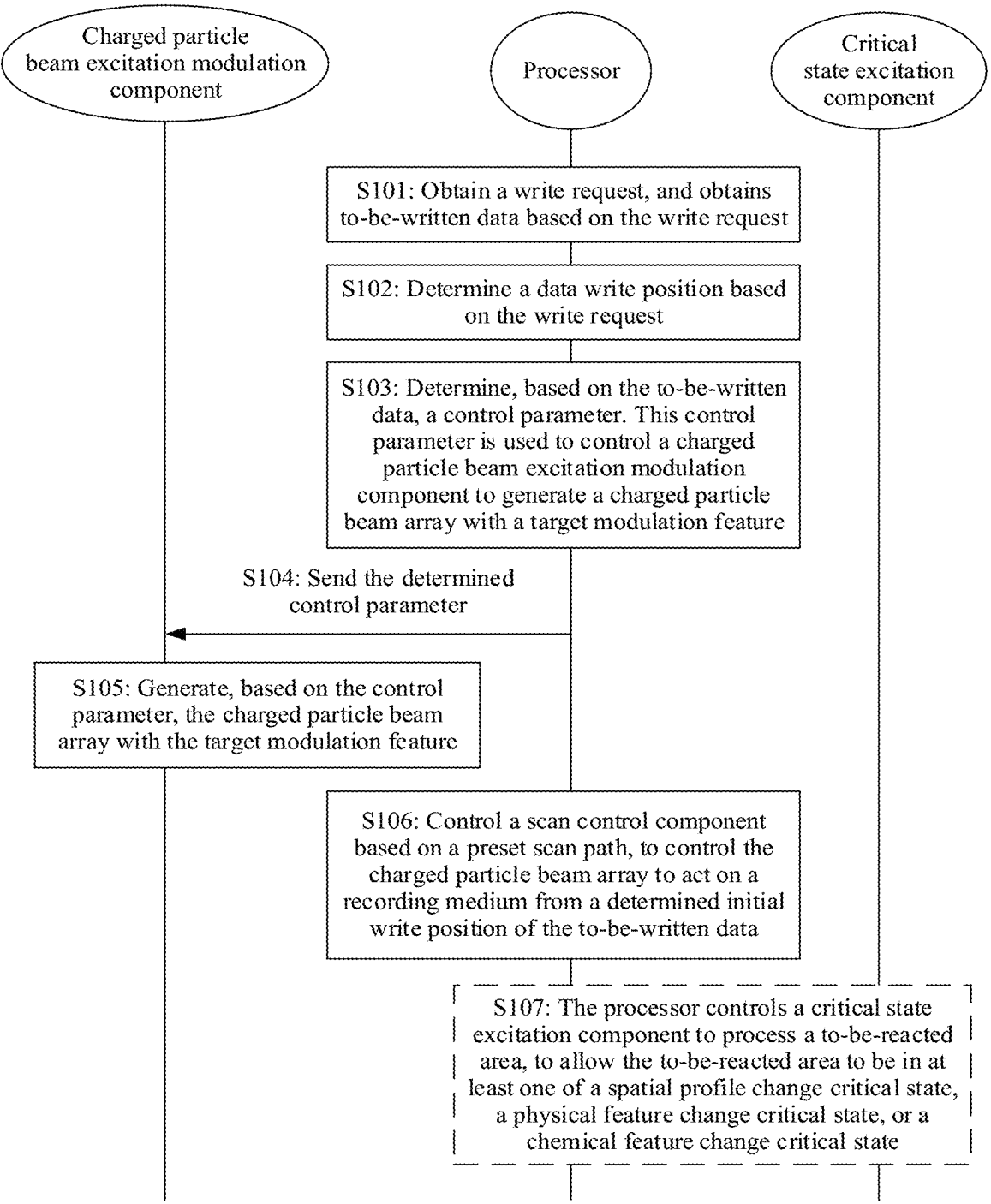
FIG. 6 is a schematic flowchart of a data writing method according to an embodiment of this disclosure.

Refer to FIG. 6. FIG. 6 is a schematic flowchart of a data writing method according to an embodiment of this disclosure. The method may be applied to the storage system 10 in FIG. 1. The method may include the following steps.

S101: A processor obtains a write request, and obtains to-be-written data based on the write request.

For example, the processor may obtain the write request through a communications interface, and obtain the to-be-written data based on the write request.

The to-be-written data herein is data encoded in binary form, that is, data encoded by using M binary bits, where M is an integer greater than or equal to 1. For example, the to-be-written data is "1", "0", "01", "11001", or "001100".

S102: The processor determines a data write position based on the write request.

Optionally, the processor may determine, according to a classification to which the to-be-written data belongs, a to-be-written area on a recording medium. The to-be-written area herein may be the large area A shown in FIG. 3. For example, if the to-be-written data is data that a user U requests to store, the processor determines that an area corresponding to the user U on the recording medium is the to-be-written area.

Further, the processor determines, in the to-be-written area, an initial data write position.

In a possible implementation, if the write request indicates that the data is written in the to-be-written area for a first time, the processor determines, according to a preset scan path, the initial data write position in the to-be-written area.

In another possible implementation, if the write request indicates that the data is not written in the to-be-written area for a first time, the processor determines, according to a last written data position in the to-be-written area and the preset scan path, a position next to the written data position as an initial write position of the to-be-written data. It may be understood that the processor stores an identifier (ID) of the written data position on the recording medium.

S103. The processor determines, based on the to-be-written data, a control parameter. This control parameter is used to control a charged particle beam excitation modulation component to generate a charged particle beam array with a target modulation feature.

The charged particle beam array herein includes one or more charged particle beams. The target modulation feature includes at least one of a shape, a spatial energy distribution, a temporal energy distribution, or a spatial action angle of the charged particle beam. After the charged particle beam array with the target modulation feature acts on the recording medium, a target recording feature corresponding to the to-be-written data is generated on the recording medium. For specific descriptions of a modulation feature (for example, the target modulation feature) of the charged particle beam, refer to the following description of the modulation feature of the charged particle beam. Details are not described herein again.

In other words, in embodiments of this disclosure, the target recording feature of the recording medium may be used to represent the to-be-written data. For example, a target recording feature 1 of the recording medium on which the charged particle beam acts may be used to represent data 1, and a target recording feature 2 of the recording medium on which the charged particle beam acts may be used to represent data 2. Alternatively, a target recording feature 1 of the recording medium on which the charged particle beam acts may be used to represent data 1, and an original status of the recording medium on which the charged particle beam does not act may be used to represent data 2. This is not limited.

The following uses an example in which different recording features generated on the recording medium on which the charged particle beam acts represent the to-be-written data for description.

The processor may determine, based on prestored to-be-written data and a predetermined mapping relationship, the control parameter.

In a possible implementation, the predetermined mapping relationship defines a correspondence between data to be written and a modulation feature of the charged particle beam array. The charged particle beam array with the modulation feature is used to generate, on the recording medium, a recording feature corresponding to the data to be written. The recording feature corresponding to the data to be written generated on the recording medium may include a spatial profile feature and at least either of a physical feature and a chemical feature. For specific descriptions of the recording feature generated on the recording medium, refer to the following description of the target recording feature. Details are not described herein again.

It should be noted that the data to be written in the predetermined mapping relationship may be a bit group including M binary bits. In an example, when M is equal to 1, the data to be written includes 1 bit, for example, "0" or "1". In this case, a correspondence between the data to be written that is prestored by the processor and the modulation feature of the charged particle beam array may be shown in Table 1.

TABLE 1

| Data to be written | Modulation feature of a charged particle beam array |
|---|---|
| 0 | Modulation feature 1 |
| 1 | Modulation feature 2 |

In another example, when M is equal to 2, the data to be written may include 2 bits, for example, "00", "01", "10", or "11". In this case, a correspondence between the data to be written that is prestored by the processor and the modulation feature of the charged particle beam array may be shown in Table 2.

TABLE 2

| Data to be written | Modulation feature of a charged particle beam array |
|---|---|
| 00 | Modulation feature 1 |
| 01 | Modulation feature 2 |

TABLE 2-continued

| Data to be written | Modulation feature of a charged particle beam array |
|---|---|
| 10 | Modulation feature 3 |
| 11 | Modulation feature 4 |

Further, the processor may determine, based on the to-be-written data and the predetermined mapping relationship, a target modulation feature corresponding to the to-be-written data. Further, the processor may determine, based on the target modulation feature, the control parameter for controlling the charged particle beam excitation modulation component to generate the charged particle beam array with the target modulation feature.

For example, if the to-be-written data is "01", based on the to-be-written data and the predetermined mapping relationship, the processor may determine that a target modulation feature corresponding to the to-be-written data "01" is the "modulation feature 2". Then the processor may determine, based on the "modulation feature 2", a control parameter for the charged particle beam excitation modulation component to generate a charged particle beam array with the modulation feature 2.

In another possible implementation, the predetermined mapping relationship defines a correspondence between data to be written and a recording feature of the recording medium, and a correspondence between the recording feature of the recording medium and the modulation feature of the charged particle beam array. The recording feature of the recording medium herein may be in a one-to-one correspondence with the modulation feature of the charged particle beam array. A charged particle beam array with a specific modulation feature is used to generate, on the recording medium, a recording feature corresponding to the data to be written. The recording feature corresponding to the data to be written generated on the recording medium may include a spatial profile feature and at least either of a physical feature and a chemical feature. For specific descriptions of the recording feature generated on the recording medium, refer to the following description of the target recording feature. Details are not described herein again.

It should be noted that for descriptions of the data to be written herein, refer to the foregoing descriptions. Details are not described herein again.

In an example, when the data to be written includes 1 bit, for example, "0" or "1". In this case, a correspondence between the data to be written that is prestored by the processor and the recording feature of the recording medium may be shown in Table 3.

TABLE 3

| Data to be written | Recording feature of a recording medium |
|---|---|
| 0 | Recording feature 1 |
| 1 | Recording feature 2 |

In another example, when the data to be written includes 2 bits, for example, "00", "01", "10", or "11". In this case, a correspondence between the data to be written that is prestored by the processor and the recording feature of the recording medium may be shown in Table 4.

TABLE 4

| Data to be written | Recording feature of a recording medium |
|---|---|
| 00 | Recording feature 1 |
| 01 | Recording feature 2 |
| 10 | Recording feature 3 |
| 11 | Recording feature 4 |

Further, the processor may determine, based on the correspondence, a target recording feature of a recording medium corresponding to the to-be-written data. Then the processor may determine, based on a correspondence between the target recording feature of the recording medium and the modulation feature of the charged particle beam array, a target modulation feature of a charged particle beam array corresponding to the to-be-written data. Further, the processor may determine, based on the target modulation feature, the control parameter for the charged particle beam excitation modulation component to generate the charged particle beam array with the target modulation feature.

For example, if the to-be-written data is "01", the processor may determine, based on the correspondence between the to-be-written data and the recording feature of the recording medium, that a target recording feature of the recording medium corresponding to "01" is the "recording feature 2". Then the processor may determine, based on a correspondence between the recording feature of the recording medium and the modulation feature of the charged particle beam array, that a modulation feature of a charged particle beam array corresponding to the "recording feature 2" is the "modulation feature 2", in other words, a target modulation feature of a charged particle beam array corresponding to the to-be-written data "01" is the "modulation feature 2".

Then the processor may determine, based on the "modulation feature 2", a control parameter for the charged particle beam excitation modulation component to generate a charged particle beam array with the modulation feature 2.

S104: The processor sends the determined control parameter to the charged particle beam excitation modulation component.

The charged particle beam excitation modulation component receives the control parameter in response to the operation of the processor.

S105: The charged particle beam excitation modulation component generates, based on the control parameter, the charged particle beam array with the target modulation feature.

The processor sets, based on the received control parameter, a parameter of each component in the charged particle beam excitation modulation component, to generate the charged particle beam array with the target modulation feature. The charged particle beam array with the target modulation feature acts on a to-be-written area of the recording medium, so that a target recording feature corresponding to the to-be-written data is generated on the recording medium.

For example, the charged particle beam excitation modulation component may set a voltage applied to an excitation medium, to adjust energy and a current density of the charged particle beam, set an electric field for accelerating or decelerating the charged particle beam to adjust a speed of the charged particle beam, set a shape and a size of a limiting aperture to adjust a size and a shape of the charged particle beam, and set a parameter of a focusing device to adjust a focusing position, a shape, a size, and the like of the charged particle beam. Details are not described herein.

A process in which the charged particle beam excitation modulation component generates the charged particle beam array used to act on the recording medium includes an excitation process of the charged particle beam array and a modulation process of the charged particle beam array. For the excitation process of the charged particle beam array, refer to the foregoing descriptions of the charged particle beam generation subcomponent 1031. Details are not described herein again. For the modulation process of the charged particle beam array, refer to the foregoing descriptions of the charged particle beam modulation subcomponent 1032 and the following descriptions. Details are not described herein again.

S106: The processor controls a scan control component based on a preset scan path, to control the charged particle beam array to act on the recording medium from a determined initial write position of the to-be-written data.

The scan path is preset in the processor. The scan path is a trajectory formed when the charged particle beam acts on different positions of the recording medium. For details, refer to the foregoing descriptions of the scan control component 104. Details are not described herein again.

Optionally, the processor may control the scan control component based on the preset scan path and the initial write position of the to-be-written data that is determined in S102, to control the charged particle beam array to act on the recording medium based on the scan path. In this case, a target recording feature corresponding to the to-be-written data is generated in a target area of the recording medium.

Optionally, the processor may control the scan control component based on the preset scan path and the initial write position of the to-be-written data that is determined in S102, to control the charged particle beam array to act on an auxiliary material layer on the recording medium based on the scan path. In this case, an auxiliary feature corresponding to the to-be-written data is generated on the auxiliary material layer. The auxiliary material layer includes one or more layers, and the auxiliary material may be disposed on the recording medium through addition, coating, or the like.

It should be noted that the auxiliary feature that is generated by the auxiliary material layer and that is corresponding to the to-be-written data is used to allow the target recording feature corresponding to the to-be-written data to be generated in the target area of the recording medium. Further, the auxiliary feature on the auxiliary material layer is transferred to the target area of the recording medium by using one or more physical or chemical etching methods, so that the target recording feature corresponding to the to-be-written data is generated in the target area of the recording medium. The one or more physical or chemical etching methods may be dry etching (such as laser etching, ion etching, or plasma etching), wet etching (such as etching by using a chemical reagent), or the like. This is not limited in this embodiment of this disclosure.

The target area herein is an area in which the charged particle beam in the charged particle beam array acts. A target recording feature of the target area includes a spatial profile feature and at least either of a physical feature and a chemical feature. For descriptions of a corresponding recording feature generated in the target area after the charged particle beam acts, refer to the following descriptions of the target recording feature. Details are not described herein again.

In embodiments of this disclosure, the charged particle beam array with the target modulation feature acts on the target area, so that a spatial profile feature and at least either of a physical feature and a chemical feature corresponding to the to-be-written data is generated in the target area, writing the to-be-written data.

When writing the data to-be-written data, the processor may periodically record a time point at which the data is written and a position corresponding to the written data of a storage unit. The position of the storage unit may be determined by using an ID of a point marked on the recording medium. One storage unit on the recording medium herein includes a reacting area of one charged particle beam on the recording medium.

S107 (Optional): The processor controls a critical state excitation component to process a to-be-reacted area, to allow the to-be-reacted area to be in at least one of a spatial profile change critical state, a physical feature change critical state, or a chemical feature change critical state.

The processor controls the critical state excitation component to process the to-be-reacted area, where the to-be-reacted area includes the target area. In this case, the target area is in at least one of the spatial profile change critical state, the physical feature change critical state, or the chemical feature change critical state. In this way, it is easier to generate the target recording feature corresponding to the to-be-written data in the target area when the charged particle beam array with the target modulation feature that is controlled to be generated by the charged particle beam excitation modulation component acts on the target area, compared with when the charged particle beam array acts on a target area that is not in the spatial profile change critical state, the physical feature change critical state, or the chemical feature change critical state. Therefore, data writing efficiency is effectively improved.

For a critical state excitation component, refer to the foregoing descriptions of the critical state excitation component 107. Details are not described herein again. The processor may process the to-be-reacted area by using at least one of heat, a laser, ultrasound, an ion beam, a plasma, or gas generated by the critical state excitation component. The gas is any gas that improves physical or chemical activity of the recording medium. This is not limited in this embodiment of this disclosure.

It may be understood that an ion in the ion beam herein may be an ion different from the ion included in the charged particle, for example, an ion of different energy or different type. Similarly, a plasma in the plasma herein may be different from the plasma included in the charged particles described above, for example, a plasma of different energy or different type.

It should be noted that S106 and S107 may be simultaneously performed, or a time period for performing S107 covers a time period for performing S106, and the time period for performing S107 does not exceed a preset time period. The preset time period may be determined based on material composition or a structure of the recording medium. When the critical state excitation component processes the to-be-reacted area within the preset time period, the recording feature of the to-be-reacted area keeps unchanged.

Figure 7:
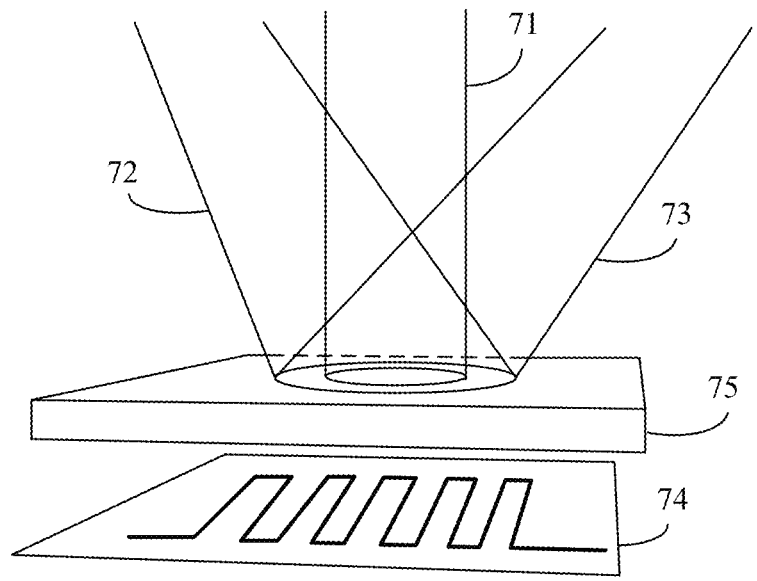
FIG. 7 is a schematic diagram of critical state excitation according to an embodiment of this disclosure.

Refer to FIG. 7. FIG. 7 shows an example of processing a to-be-reacted area by using at least one of heat, a laser, ultrasound, an ion beam, a plasma, or specific gas. The to-be-reacted area includes a target area. 71 indicates a charged particle beam array that acts on the target area of a recording medium 75, and may be a single charged particle beam, a dual charged particle beam, or a multi charged particle beam. 72 may indicate that the recording medium 75 is processed by using at least either of the laser and the gas. 73 may indicate that the recording medium 75 is processed by using at least one of the ultrasound, the ion beam, or the plasma. 74 may indicate that the to-be-reacted area of the recording medium is heated by using a resistance wire.

The data writing method provided in embodiments of this disclosure can be implemented by performing the foregoing steps.

The following describes a modulation feature of the charged particle beam. The modulation feature of the charged particle beam includes at least one of a shape, a spatial energy distribution, a temporal energy distribution, or a spatial action angle of the charged particle beam.

1. Charged particle beam shape modulation: A shape of a single charged particle beam may be modulated, by using the modulation device of the charged particle beam modulation subcomponent 1032, into various basic shapes and variants of the basic shapes. The basic shape may be a circle, a line, a rod, an ellipse, a rectangle, a triangle, a polygon, or the like. The variant of the basic shape can be obtained by changing a length-width ratio, symmetry, an angle of rotation, and a partial axial/regional variant of the basic shape.

Figure 8A:
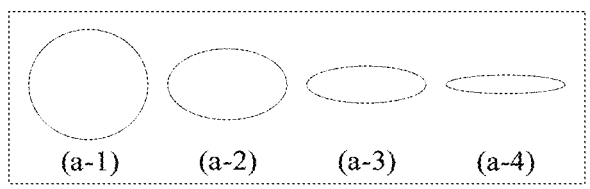
FIG. 8A, FIG. 8B, FIG. 8C, FIG. 8D, and FIG. 8E schematic diagrams of a modulation feature of a charged particle beam according to an embodiment of this disclosure.
Figure 8B:
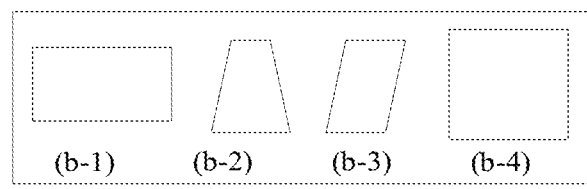
Figure 8C:
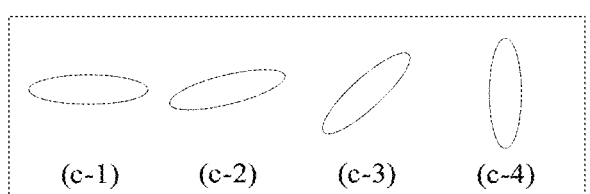
Figure 8D:
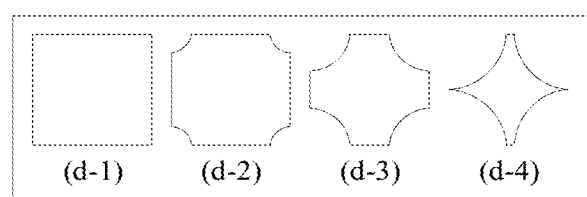
Figure 8E:
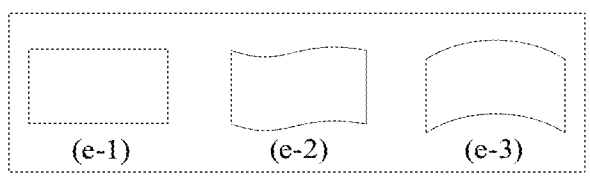

Refer to FIGS. 8A-8E. FIGS. 8A-8E show examples of several basic shapes and variants of the basic shapes that are obtained by modulating a single charged particle beam using a modulation device. A basic shape shown in FIG. 8A is a circle a-1, and an ellipse a-2, an ellipse a-3, and an ellipse a-4 that are obtained by changing based on a length ratio of two diameters of the circle a-1 that are perpendicular to each other. A basic shape shown in FIG. 8B is a rectangle b-1, and an isosceles trapezoid b-2, a parallelogram b-3, and a square b-4 that are symmetrically changed from the rectangle b-1. A basic shape shown in FIG. 8C is an ellipse c-1, and an ellipse c-2, an ellipse c-3, and an ellipse c-4 that are obtained by rotating the ellipse c-1 by different angles. A basic shape shown in FIG. 8D is a square d-1, and shapes d-2, d-3, and d-4 that are obtained by changing a partial area of the square d-1. A basic shape shown in FIG. 8E is a rectangle e-1, and shapes e-2 and e-3 that are partially axially changed from the rectangle e-1.

For a dual charged particle beam, two dual charged particle beams may be modulated, by using the modulation device of the charged particle beam modulation subcomponent 1032, into a combination or superposition of basic shapes, or into a combination or superposition of variants of basic shapes. The combined or superposed shape is used as a shape of one charged particle beam set.

Refer to FIGS. 9A-9C. FIGS. 9A-9C show a plurality of shapes obtained by modulating a dual charged particle beam is modulated using a modulation device. FIG. 9A shows a combination a-1 of basic shapes, that is, circles and lines, and combinations a-2 and a-3 that are obtained by changing the circles and the lines. FIG. 9B shows a combination b-1 of basic shapes, that is, circles and rectangles, and combinations b-2 and b-3 that are obtained by changing the circles and rotating the rectangles by different angles. FIG. 9C shows a combination of basic shapes, that is, circles, and shapes c-2 and c-3 that are obtained by superposing the two circles to different extents.

For a multi charged particle beam, a plurality of charged particle beams may be modulated, by using the modulation device of the charged particle beam modulation subcomponent 1032, into a combination or superposition of basic shapes, or into a combination or superposition of variants of basic shapes, or into different position arrangements of basic shapes. The combined, superposed, or arranged shape is used as a shape of one charged particle beam set.

Refer to FIGS. 10A-10C. FIGS. 10A-10C shows a plurality of shapes obtained by modulating three charged particle beams is modulated using a modulation device. FIGS. 10A-10C separately show shapes obtained by arranging three basic shapes, that is, circles in different positions.

2. Spatial energy distribution modulation: For a single charged particle beam, a spatial energy distribution of the single charged particle beam includes a current density of the charged particle beam or a spatial distribution of charged particle energy, and spatial energy distribution modulation of the charged particle beam includes spatial distribution modulation of the current density of the charged particle beam or spatial distribution modulation of charged particle energy of the charged particle beam. A modulation method of the spatial energy distribution includes modulation of an intensity distribution, a variant, rotation, a symmetric change, or the like of the charged particle beam.

Refer to FIG. 11. FIG. 11 shows examples of different spatial energy distributions of a single charged particle beam with a basic shape of circle that is obtained by modulating using the modulation device in the charged particle beam modulation subcomponent 1032.

For a dual charged particle beam, spatial energy distribution modulation may be performed by modulating at least either of a spatial distribution of a current density and a spatial distribution of charged particle energy of two charged particle beams, and then combination or superposition is performed.

Figure 12:
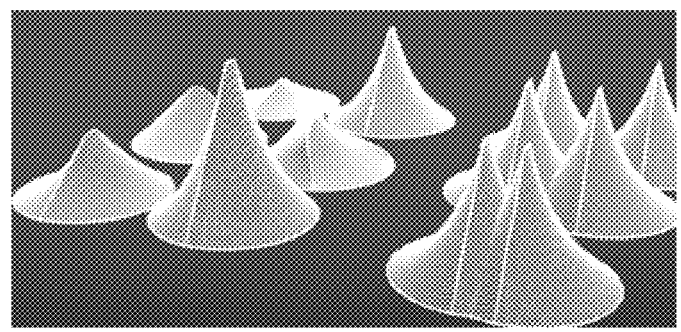
FIG. 12 is a schematic diagram of a modulation feature of a charged particle beam according to an embodiment of this disclosure.

Refer to FIG. 12. FIG. 12 shows examples of spatial energy distributions of two charged particle beams with a basic circular shape that are combined or superposed and that are obtained by modulating using the modulation device in the charged particle beam modulation subcomponent 1032.

For a multi charged particle beam, spatial energy distribution modulation may be performed by modulating at least either of a spatial distribution of a current density and a spatial distribution of charged particle energy of a plurality of charged particle beams, and then combination, superposition, or arrangement at different locations is performed.

Figure 13:
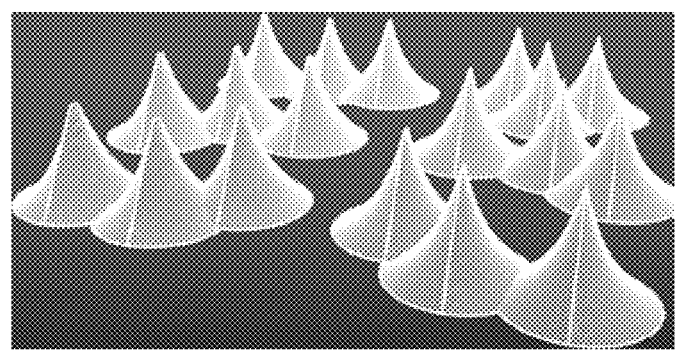
FIG. 13 is a schematic diagram of a modulation feature of a charged particle beam according to an embodiment of this disclosure.

Refer to FIG. 13. FIG. 13 shows examples of spatial energy distributions of three charged particle beams with a basic circular shape that are combined, superposed, or arranged at different positions and that are obtained by modulating using the modulation device in the charged particle beam modulation subcomponent 1032.

3. Temporal energy distribution modulation: The temporal energy distribution modulation of the charged particle beam includes continuous modulation and pulse modulation.

For a single charged particle beam, temporal energy distribution modulation of the continuous single charged particle beam includes modulation duration of the continuous single charged particle beam. A pulse single charged particle beam includes a single pulse mode and a multi-pulse mode. In single pulse mode, temporal energy distribution modulation of a single pulse single charged particle beam includes pulse width modulation and dynamic distribution modulation of charged particle energy or a current density. In multi-pulse mode, temporal energy distribution modulation of a multi-pulse single charged particle beam includes multi-pulse width combined modulation, action period number modulation, dynamic distribution combined modulation of multi-pulse charged particle energy and/or a current density, multi-pulse action temporal group modulation, and the like.

Figure 14:
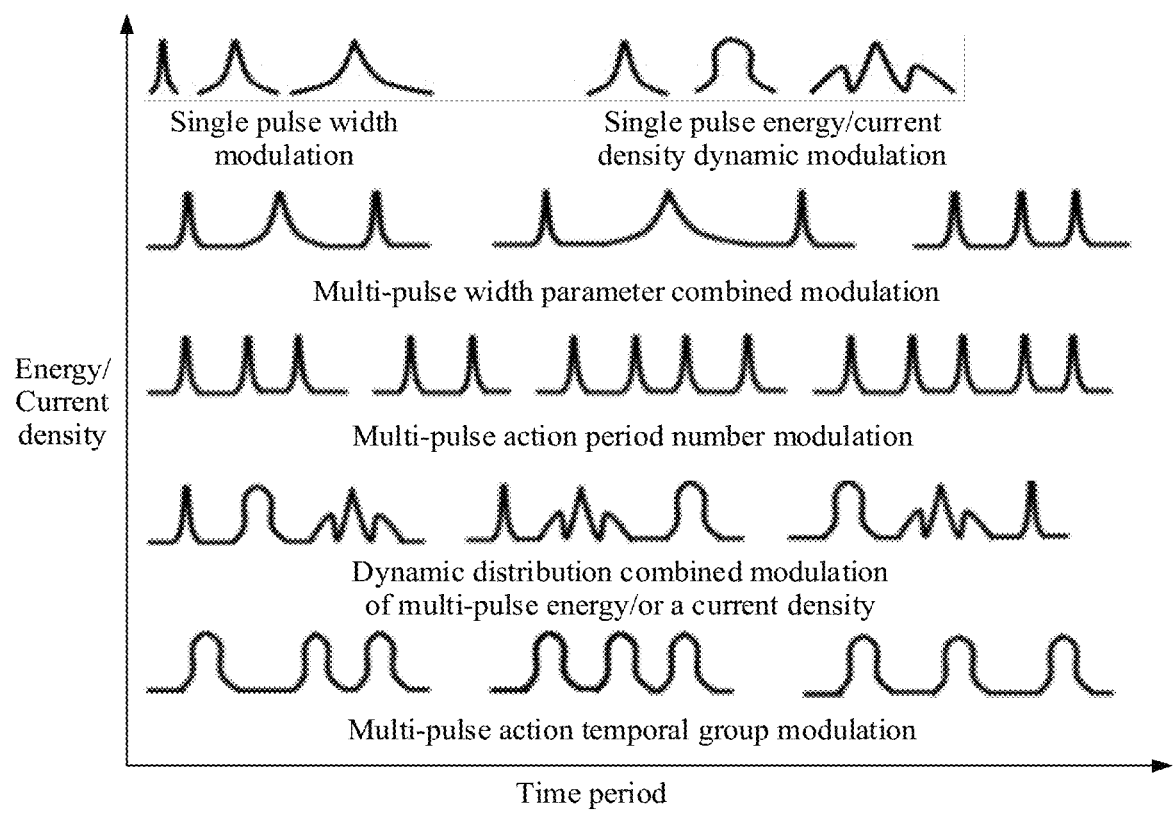
FIG. 14 is a schematic diagram of a modulation feature of a charged particle beam according to an embodiment of this disclosure.

Refer to FIG. 14. FIG. 14 shows an example of a temporal energy distribution modulation result of a single charged particle beam that is obtained by modulating using the modulation device in the charged particle beam modulation subcomponent 1032.

For a dual charged particle beam, temporal energy distribution modulation may be performed by combining or superimposing one or more modulation methods of two single charged particle beams.

Figure 15:
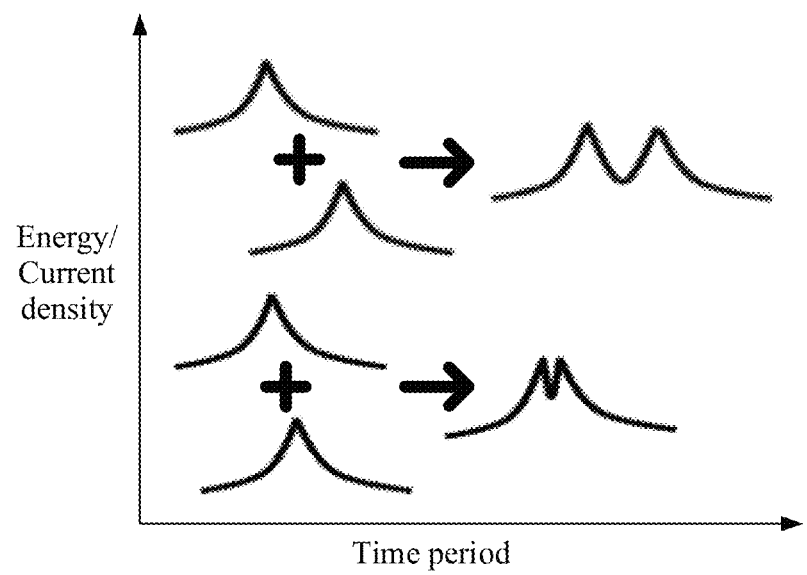
FIG. 15 is a schematic diagram of a modulation feature of a charged particle beam according to an embodiment of this disclosure.

Refer to FIG. 15. FIG. 15 shows an example of a temporal energy distribution superposition modulation result of a dual charged particle beam that is obtained by modulating using the modulation device in the charged particle beam modulation subcomponent 1032.

For a multi charged particle beam, temporal energy distribution modulation may be performed through combination, superposition, or arrangement at different time sequences of one or more modulation methods of a plurality of single charged particle beams.

Figure 16:
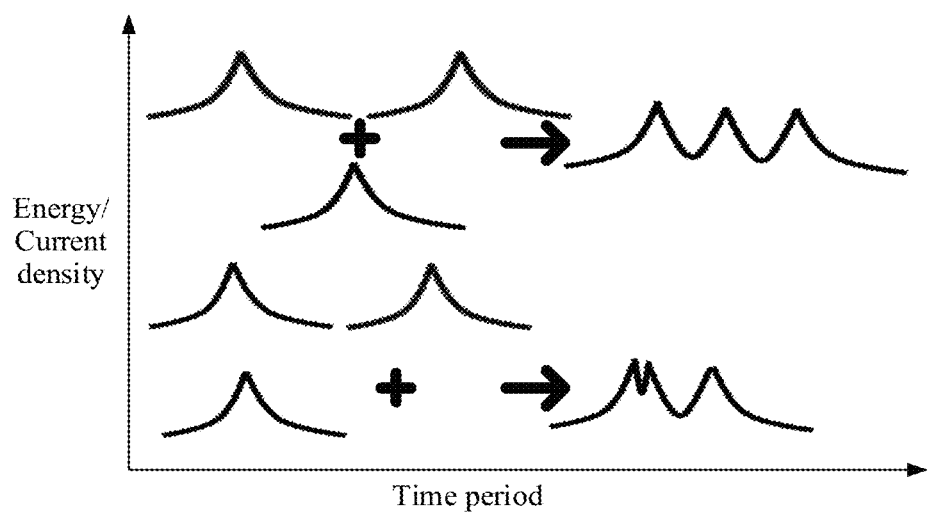
FIG. 16 is a schematic diagram of a modulation feature of a charged particle beam according to an embodiment of this disclosure.

Refer to FIG. 16. FIG. 16 shows an example of a temporal energy distribution superposition and temporal arrangement modulation result of three single charged particle beams that are obtained by modulating using the modulation device in the charged particle beam modulation subcomponent 1032.

4. Spatial action angle modulation: One or more of charged particle beams in a single charged particle beam, a dual charged particle beam, and a multi charged particle beam may be modulated, by using a charged particle beam modulation device, into a charged particle beam that acts on a recording medium at a specific spatial angle.

For example, refer to FIGS. 17A-17F. FIG. 17A shows spatial action angle modulation of a single charged particle beam. FIG. 17B and FIG. 17C show spatial action angle modulation of a dual charged particle beam. FIGS. 17D-17F show spatial action angle modulation of three charged particle beams.

The following describes a target recording feature generated in a target area of a recording medium after a charged particle beam acts on the target area.

1. After the charged particle beam acts on the target area, the target area may exhibit a basic spatial profile, a variant of a basic profile, or a combination of a basic profile and a variant of the basic profile. The basic spatial profile includes a dent, a wiring groove, a hole, a protrusion, and the like. The variant of the basic profile includes the variant of the basic profile in terms of a length-width ratio, a depth, a height, symmetry, or an angle of rotation, or a partial axial/regional variant of the basic profile.

Figure 18A:
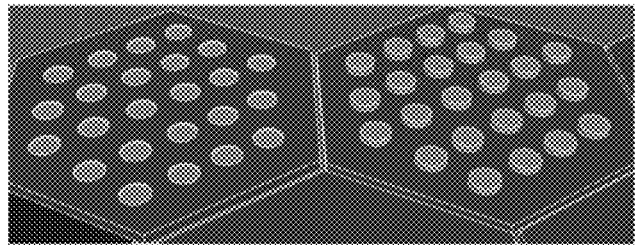
FIG. 18A, FIG. 18B, FIG. 18C, FIG. 18D, FIG. 18E, and FIG. 18F are schematic diagrams of a recording feature of a recording medium according to an embodiment of this disclosure.
Figure 18B:
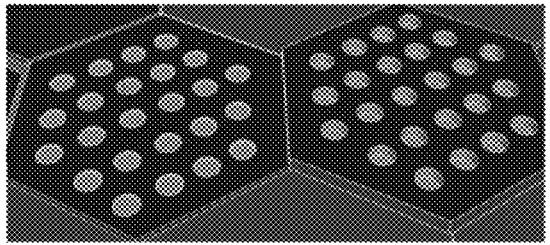
Figure 18C:
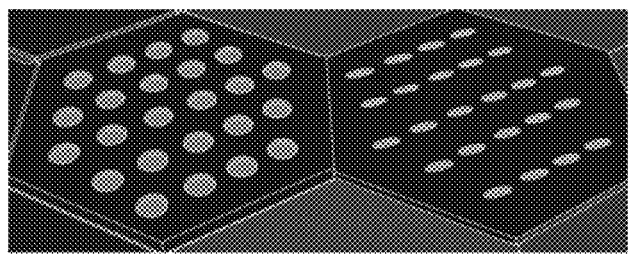
Figure 18D:
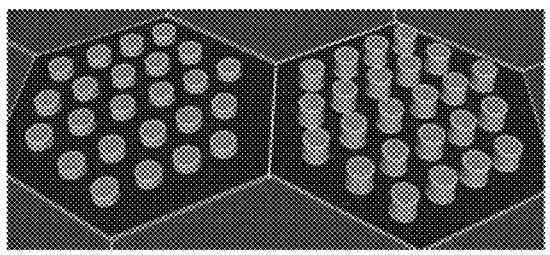
Figure 18E:
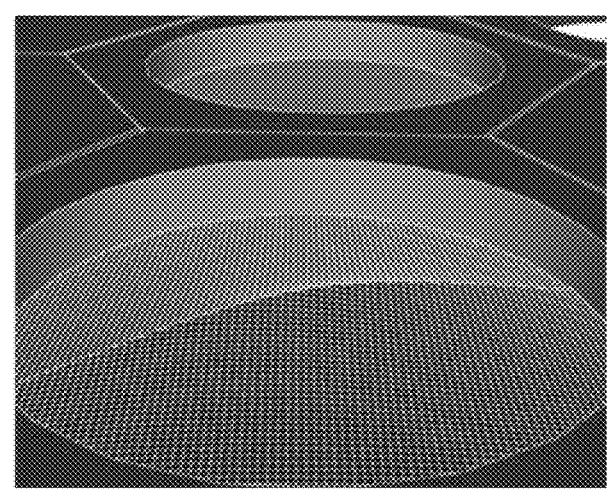
Figure 18F:
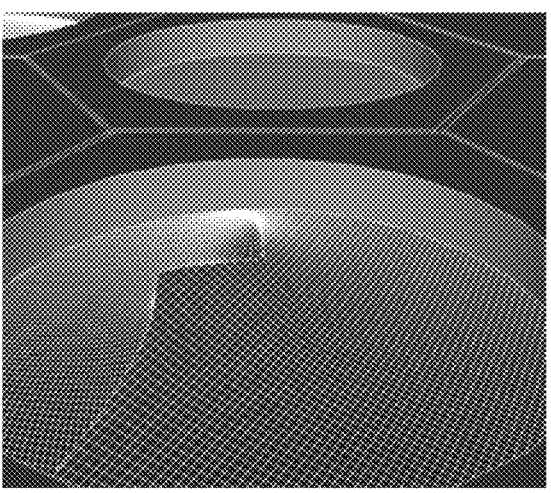

Refer to FIGS. 18A-18F. FIGS. 18A-18F show examples of several spatial profiles generated after a charged particle beam acts on a target area. FIG. 18A shows basic profiles: circular dents and circular protrusions. FIG. 18B shows two types of circular dents of different depths. FIG. 18C shows a basic profile circular dent, and an elliptical dent obtained by changing the basic profile circular dent. FIG. 18D shows two types of circular protrusions of different heights. FIG. 18E and FIG. 18F show two types of variants of a circular dent. Bottom surfaces of two variant circular dents have circular dents of profiles shown in FIG. 18E and FIG. 18F.

Figure 19:
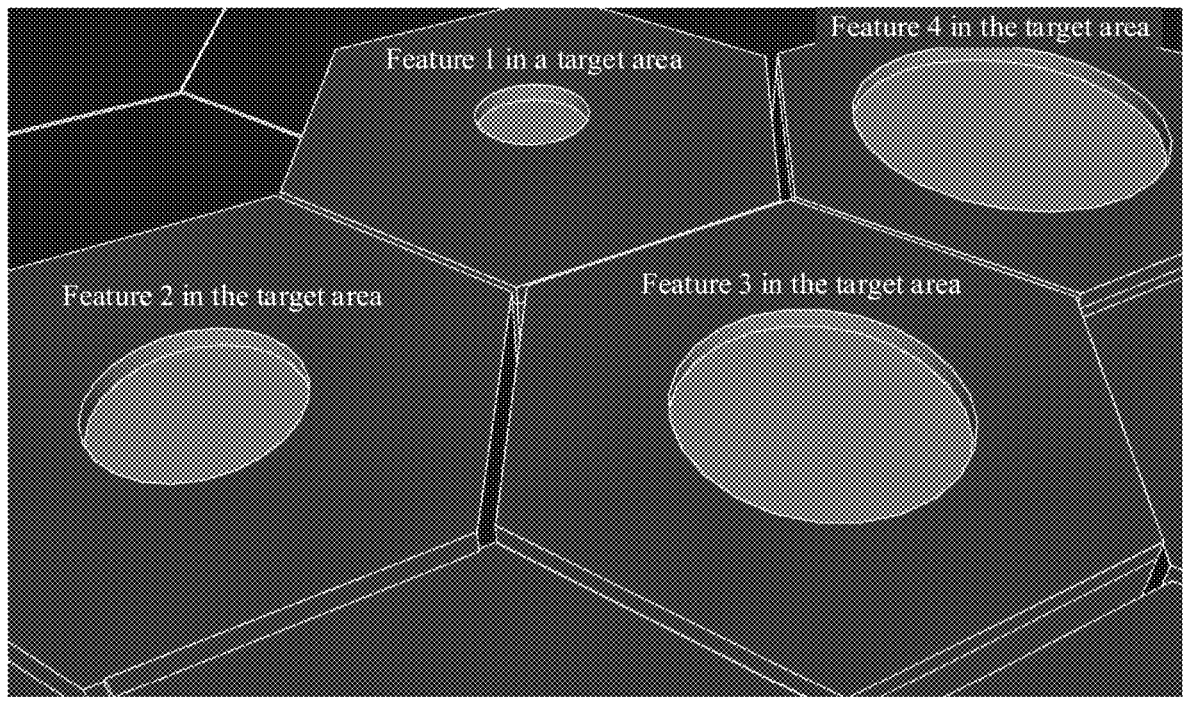
FIG. 19 is a schematic diagram of a recording feature of a recording medium according to an embodiment of this disclosure.

Refer to FIG. 19. FIG. 19 shows examples of circular spatial profile features of different diameters generated after a charged particle beam acts on a target area. The circular spatial profile features of different diameters in the target area are corresponding to different written data. For example, a spatial profile feature 1 (namely, a circular dent having a diameter 1) in the target area may be corresponding to written data "00", a spatial profile feature 2 (namely, a circular dent having a diameter 2) in the target area may be corresponding to written data "01", a spatial profile feature 3 (namely, a circular dent having a diameter 3) in the target area may be corresponding to written data "10", and a spatial profile feature 4 (namely, a circular dent having a diameter 4) in the target area may be corresponding to written data "11".

2. Before and after the charged particle beam acts on the target area, the target area may have a different physical feature or a chemical feature.

In a case, after the charged particle beam acts on the target area of a recording medium, different physical and chemical feature changes may be generated in the target area. Alternatively, when the charged particle beam acts on the target area of a recording medium, a critical state excitation component simultaneously processes the target area. In this case, different physical and chemical feature changes may also be generated in the target area.

Figure 20A:
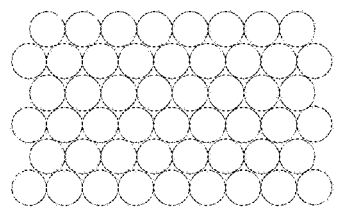
FIG. 20A, FIG. 20B, and FIG. 20C are schematic diagrams of a recording feature of a recording medium according to an embodiment of this disclosure.
Figure 20B:
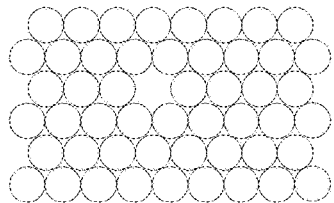
Figure 20C:
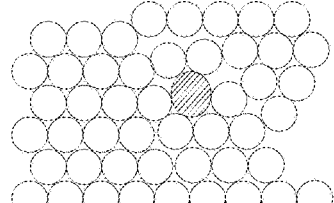

Refer to FIGS. 20A-20C. FIGS. 20A-20C show examples of different physical and chemical feature changes, which may be shift, dislocation, implantation, or replacement of one or more original atoms/ions, or implantation or replacement of other atoms/ions. As shown in FIGS. 20A-20C, FIG. 20A indicates an atomic arrangement of a target area on which no charged particle beam acts, and FIG. 20B indicates an atomic arrangement of a target area on which a charged particle beam acts. It can be learned from FIG. 20B that one atom/ion is dislocated. FIG. 20C indicates another atomic arrangement of a target area on which a charged particle beam acts. It can be learned from FIG. 20C that a new atom/ion (an atom/ion shown in a shadow in the figure) is implanted.

In another case, after a charged particle beam acts on a target area of a recording medium, atomic order of the target area changes, that is, an atomic arrangement status may change from one state to another state. For example, the atomic arrangement status of the target area may be mutually converted between a single crystalline state, a polycrystalline state, and an amorphous state. Atomic arrangement order of the single crystalline state is higher than that of the polycrystalline state, and atomic arrangement order of the polycrystalline state is higher than that of the amorphous state. For another example, an atomic arrangement structure of the target area may be converted from a body centered cubic structure to a face-centered cubic structure.

Figure 21A:
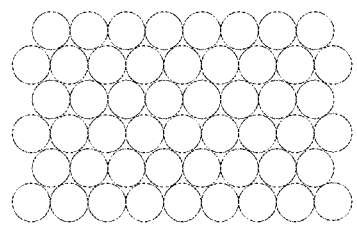
FIG. 21A, FIG. 21B, and FIG. 21C are schematic diagrams of a recording feature of a recording medium according to an embodiment of this disclosure.
Figure 21B:
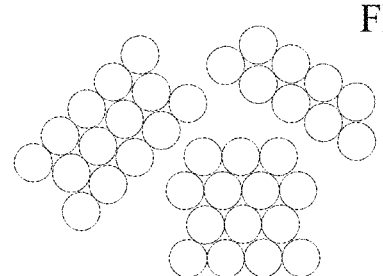
Figure 21C:
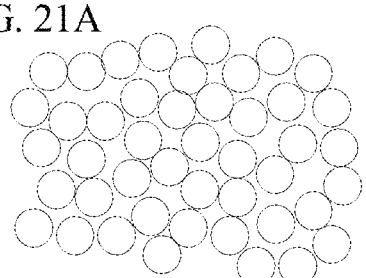

Refer to FIGS. 21A-21C. FIGS. 21A-21C show differences between a single crystalline state, a polycrystalline state, and an amorphous state. FIG. 21A shows a single crystalline atomic arrangement, FIG. 21B shows a polycrystalline atomic arrangement, and FIG. 21C shows an amorphous atomic arrangement.

Figure 22A:
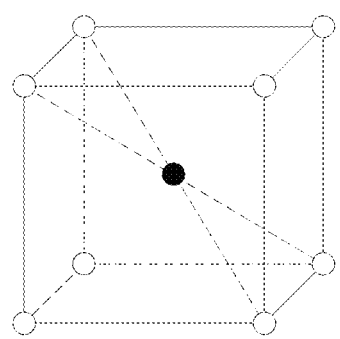
FIG. 22A and FIG. 22B are schematic diagrams of a recording feature of a recording medium according to an embodiment of this disclosure.
Figure 22B:
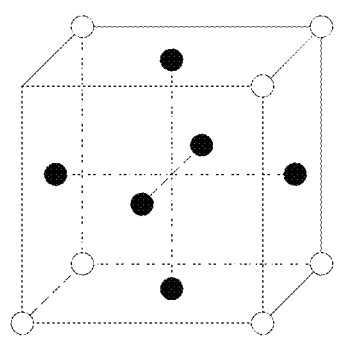

Refer to FIG. 22A and FIG. 22B. FIG. 22A and FIG. 22B show that an atomic arrangement structure is converted from a body centered cubic structure to a face centered cubic structure before and after a charged particle beam acts in another target area. The atomic arrangement structure shown in FIG. 22A is a body centered cubic structure. The arrangement structure may be an atomic arrangement structure of the target area before the charged particle beam acts on the target area. The atomic arrangement structure shown in FIG. 22B is a face centered cubic structure. The atomic arrangement structure may be an atomic arrangement structure of the target area after the charged particle beam acts on the target area. This is not limited in this embodiment of this disclosure.

Figure 23A:
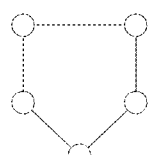
FIG. 23A and FIG. 23B are schematic diagrams of a recording feature of a recording medium according to an embodiment of this disclosure.
Figure 23B:

In another case, after a charged particle beam acts on a target area of a recording medium, isomerism may occur in a molecular structure of the target area, for example, chain isomerism, positional isomerism, functional group isomerism, enantiomer isomerism, cis-trans isomerism, conformational isomerism, polymerization/degradation, or the like. FIG. 23A and FIG. 23B show chain isomerism. Before a charged particle beam acts on a target area, a molecular structure of the target area may be a ring-shaped molecular structure, as shown in FIG. 23A, after the charged particle beam acts on the target area, a molecular structure of the target area may be converted into a chain molecular structure, as shown in FIG. 23B. This is not limited in this embodiment of this disclosure.

Alternatively, after a charged particle beam acts on a target area, a molecular formula ratio of the target area of a recording medium changes, for example, a ratio of one or more elements in a compound changes. For example, $Co_3O_4$ is transformed into $Co_2O_3$, or graphene oxide is converted to reduced graphene oxide.

In another case, after a charged particle beam acts on a target area of a recording medium, diffusion, separation, chemical reaction, or the like may occur between different components. For example, after the charged particle beam acts on aluminum oxide/silicon double-layer thin film material, silicon dioxide is formed at an interface of the material.

The foregoing describes the data writing method provided in embodiments of this disclosure. The following describes a data reading method provided in embodiments of this disclosure.

Figure 24:
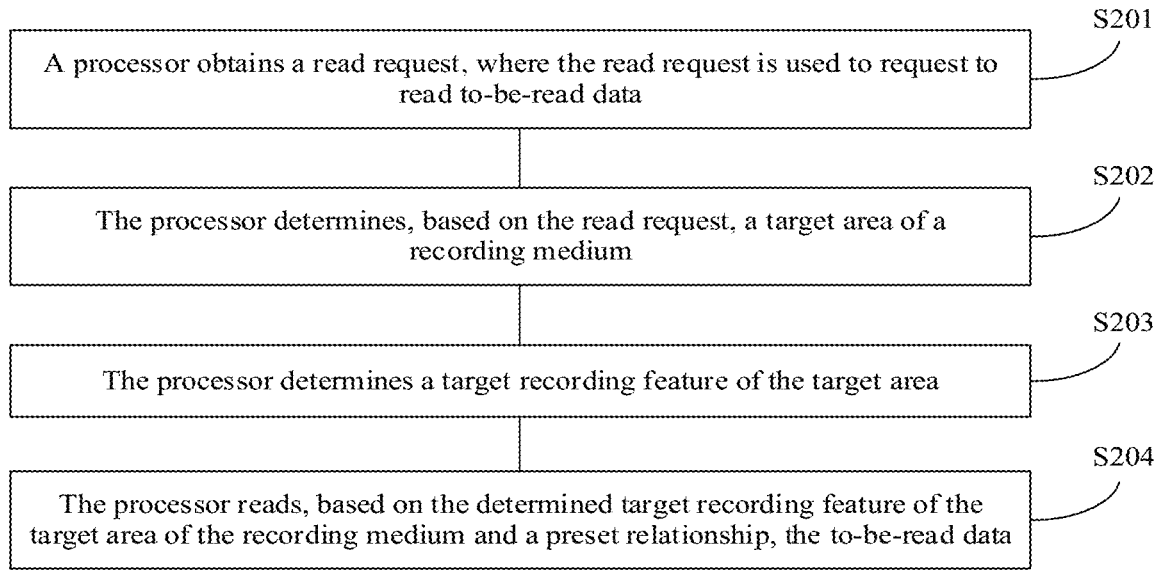
FIG. 24 is a schematic flowchart of a data reading method according to an embodiment of this disclosure.

Refer to FIG. 24. FIG. 24 is a schematic flowchart of a data reading method according to an embodiment of this disclosure. The method may be applied to the storage system 10 in FIG. 1, and the method includes the following steps.

S201: A processor obtains a read request, where the read request is used to request to read to-be-read data.

The read request includes classification information of requested data to be read. The classification information may be classified by user, data type, or time. This is not limited in this embodiment of this disclosure.

The processor may obtain the read request through a communications interface, or obtain the read request in any other manner. This is not limited in this embodiment of this disclosure.

S202. The processor determines, based on the read request, a target area of a recording medium.

The target area of the recording medium herein is an area used to store the to-be-read data. The target area may be one storage unit, or a collection of a plurality of storage units.

Optionally, the processor records information about a classification to which data belongs during data writing. Therefore, the processor may determine a position of the target area of the recording medium based on the classification information that is of the to-be-read data and that is carried in the read request.

S203. The processor determines a target recording feature of the target area.

The target recording feature of the target area includes a spatial profile feature and at least either of a physical feature and a chemical feature of the target area.

Further, the processor may determine the target recording feature of the target area in any one of the following methods.

Method 1:

S11: The processor controls a charged particle beam excitation modulation component to generate a charged particle beam array, where a parameter of a charged particle beam in the charged particle beam array is less than a preset threshold. In this case, when the charged particle beam array acts on the target area, a written spatial profile feature, a written physical feature, or a written chemical feature of the target area is not changed or damaged.

The charged particle array is different from the charged particle beam array in S105. The charged particle beam array herein includes one or more charged particle beams.

The parameter of the charged particle beam in the charged particle beam array is less than the preset threshold, so that the spatial profile feature, the physical feature, or the chemical feature of the target area may keep unchanged before and after the charged particle beam acts on the target area.

S12: The processor controls the charged particle beam array to act in a reacting area of the recording medium, where the reacting area includes a target area.

The processor controls a scan control component based on a preset scan path, to control the charged particle beam array to act on the reacting area of the recording medium. One charged particle beam acts on one storage unit on the recording medium.

S13: A charged particle beam imaging component obtains a charged particle image obtained by acting on the charged particle beam array on the target area.

Further, the charged particle image collection component first collects one or more of reflected charged particles, scattered charged particles, transmitted charged particles, diffractive charged particles, or refracted charged particles that are obtained by acting on the charged particle beam array on the target area. Then the charged particle image collection component generates, based on the collected charged particles, at least one of a reflected charged particle image, a scattered charged particle image, a transmitted charged particle image, a diffractive charged particle image, or a refracted charged particle image, and sends the at least one of the reflected charged particle image, the scattered charged particle image, the transmitted charged particle image, the diffractive charged particle image, or the refracted charged particle image to the processor.

S14. The processor determines, based on the received charged particle image, the spatial profile feature, the physical feature, or the chemical feature of the target area.

The processor extracts image feature information of the received charged particle image, and determines, based on the image feature information, a spatial profile feature, a physical feature, or a chemical feature of each storage unit in the target area.

Method 2:

S21: The processor controls a charged particle beam excitation modulation component to generate a charged particle beam array, where a parameter of a charged particle beam in the charged particle beam array is less than a preset threshold. In this case, when the charged particle beam array acts on the target area, a written spatial profile feature, a written physical feature, or a written chemical feature of the target area is not changed or damaged.

The charged particle array is different from the charged particle beam array in S105. The charged particle beam array herein includes a plurality of charged particle beams, and the plurality of charged particle beams are coherent charged particle beams.

S22: The processor controls the charged particle beam array to act in a reacting area of the recording medium, where the reacting area includes a target area.

The processor controls a scan control component based on a preset scan path, to control the charged particle beam array to act on the target area. One charged particle beam may act on one or more storage units.

S23: A charged particle beam imaging component obtains a diffractive charged particle image obtained by acting on the charged particle beam array on the target area.

Further, the charged particle image collection component first collects a diffractive charged particle that is obtained by acting on the charged particle beam array in the target area, and generates, based on the diffractive charged particle, the diffractive charged particle image. Then the charged particle image collection component sends the diffractive charged particle image to the processor.

S24: The processor determines, based on the obtained diffractive charged particle image, the spatial profile feature, the physical feature, or the chemical feature of the target area.

Based on the diffractive charged particle image, a diffractive charged particle image feature, and charged particle beam array feature information, the processor determines the spatial profile feature, the physical feature, or the chemical feature of the target area.

Further, a principle of determining the feature of the target area by acting a coherent charged particle beam (the charged particle beam array in S21) on a target area of a recording medium may be as following. An incident coherent charged particle beam acts on the target area of the recording medium with the spatial profile feature, the physical feature, or the chemical feature, which may be equivalent to that an incident charged particle beam reacts with the target area with the spatial profile feature, the physical feature, or the chemical feature, so that a corresponding change occurs in an amplitude and a phase of the emergent charged particle beam. This change is corresponding to the spatial profile feature, the physical feature, or the chemical feature of the target area. The emergent diffractive charged particle that acts on the target area is collected, to obtain the diffractive image. Then amplitude intensity information is extracted from the diffractive image. Then emergent charged particle beam information and feature information of the target area are continuously iterated based on the amplitude information. The spatial profile feature, the physical feature, or the chemical feature of the target area is obtained during iteration convergence.

S204. The processor reads, based on the determined target recording feature of the target area of the recording medium and a preset relationship, the to-be-read data.

The preset relationship herein defines a correspondence between the data to be read and a recording feature of the recording medium. For descriptions of the correspondence between the data to be read and the recording feature of the recording medium, refer to the foregoing descriptions of the correspondence between the data to be written and the recording feature of the recording medium in S103. Details are not described herein again.

Further, the processor reads, based on the determined target recording feature of the target area of the recording medium and the correspondence, the to-be-read data.

An embodiment of this disclosure provides a data writing method. In the method, the charged particle beam array acts on the recording medium, to generate, in the acted target area, a target recording feature corresponding to the to-be-written data, implementing data writing. The target recording feature corresponding to the to-be-written data generated in the acted target area may include a spatial profile feature and at least either of a physical feature and a chemical feature of the recording medium. Because a spot size of the charged particle beam may be controlled below 10 nm, the data writing method provided in embodiments of this disclosure can increase a data storage capacity.

In addition, in the data writing method and the data reading method provided in embodiments of this disclosure, the charged particle beam can be controlled only by modulating an electric field and a magnetic field, without introducing a problem such as complex optical path control and a precision machined lens in an optical storage system. Therefore, a simple system composition reduces an error in a read and write process, improves system reliability, and further reduces costs.

In addition, in embodiments of this disclosure, a material with a stable property may be used as a recording medium material, for example, glass, ceramic, a semiconductor material with a stable physical and chemical property, or a composite material with a stable physical and chemical property. Therefore, stored data can remain non-volatile for 50 years or even more than 100 years.

The foregoing mainly describes the solutions provided in embodiments of this disclosure from the perspective of the methods. To implement the foregoing functions, corresponding hardware structures and/or software modules for performing the functions are included. A person skilled in the art should be easily aware that, in combination with the examples of units and algorithm steps described in embodiments disclosed in this specification, this disclosure can be implemented by hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this disclosure.

In embodiments of this disclosure, function modules of a data writing apparatus and a data reading apparatus may be divided based on the foregoing method examples. For example, each function module may be divided corresponding to each function, or two or more functions may be integrated into one processing module. The integrated module may be implemented in a form of hardware, or may be implemented in a form of a software function module. It should be noted that, in this embodiment of this disclosure, module division is exemplary, and is merely a logical function division. In actual implementation, another division manner may be used.

Figure 25:
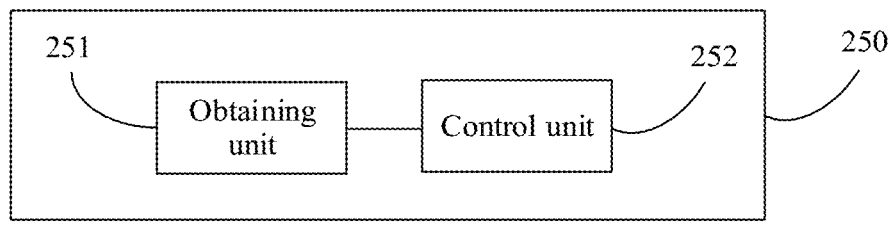
FIG. 25 is a schematic diagram of a structure of a data writing apparatus according to an embodiment of this disclosure.

FIG. 25 shows a schematic diagram of a structure of a data writing apparatus 250 according to an embodiment of this disclosure. The data writing apparatus 250 is used in a storage system. The storage system further includes a charged particle beam excitation modulation component and a recording medium. The data writing apparatus 250 is configured to perform the foregoing data writing method, for example, is configured to perform the method shown in FIG. 6. The data writing apparatus 250 may include an obtaining unit 251 and a control unit 252.

The obtaining unit 251 is configured to obtain to-be-written data. The control unit 252 is configured to control, based on the to-be-written data, the charged particle beam excitation modulation component to generate a charged particle beam array with a target modulation feature, where the charged particle beam array includes one or more charged particle beams, and configured to control the charged particle beams in the charged particle beam array to act on the recording medium, to generate, in a target area of the recording medium, a target recording feature corresponding to the to-be-written data. A target area is an area in which the charged particle beams in the charged particle beam array reacts with the recording medium.

For example, with reference to FIG. 6, the obtaining unit 251 may be used to perform S101, and the control unit 252 may be used to perform S103 and S106.

Optionally, the control unit 252 is further configured to control, based on the to-be-written data and a predetermined mapping relationship, the charged particle beam excitation modulation component to generate the charged particle beam array with the target modulation feature. The mapping relationship defines a correspondence between data to be written and a modulation feature of the charged particle beam array. The charged particle beam array with the modulation feature is used to generate, on the recording medium, a recording feature corresponding to the data to be written. The recording feature includes a spatial profile feature and at least either of a physical feature and a chemical feature.

For example, with reference to FIG. 6, the control unit 252 may be used to perform S103.

Optionally, the control unit 252 is further configured to control the charged particle beams in the charged particle beam array to act on an auxiliary material layer on the recording medium, to generate, on the auxiliary material layer on the recording medium, an auxiliary feature corresponding to the to-be-written data. The auxiliary feature corresponding to the to-be-written data generated on the auxiliary material layer is used to generate, in the target area of the recording medium, the target recording feature corresponding to the to-be-written data. The auxiliary material layer includes one or more layers.

For example, with reference to FIG. 6, the control unit 252 may be used to perform S106.

Optionally, the storage system further includes a scan control component. The scan control component is configured to control, based on a preset scan path, the charged particle beam array to act on the recording medium. The control unit 252 is further configured to control the scan control component based on the preset scan path, to control the charged particle beam array to act on the target area.

For example, with reference to FIG. 6, the control unit 252 may be used to perform S106.

Optionally, the recording feature includes the spatial profile feature. The spatial profile feature includes a circular spatial profile feature, and circular spatial profile features of different diameters are in a one-to-one correspondence with the data to be written. Alternatively, the recording feature includes the spatial profile feature. The spatial profile feature includes an elliptical spatial profile feature, and elliptical spatial profile features of different sizes are in a one-to-one correspondence with the data to be written. Alternatively, the recording feature includes at least either of the physical feature and the chemical feature, and the spatial profile feature. The spatial profile feature includes a circular spatial profile feature, the physical feature includes a physical feature in the circular spatial profile feature of the recording medium, and the chemical feature includes a chemical feature in the circular spatial profile feature of the recording medium. Circular spatial profile features of different diameters that include at least either of the physical feature and the chemical feature are in a one-to-one correspondence with the data to be written. Alternatively, the recording feature includes at least either of the physical feature and the chemical feature, and the spatial profile feature. The spatial profile feature includes an elliptical spatial profile feature, the physical feature includes a physical feature in the elliptical spatial profile feature of the recording medium, and the chemical feature includes a chemical feature in the elliptical spatial profile feature of the recording medium. Elliptical spatial profile features of different sizes that include at least either of the physical feature and the chemical feature are in a one-to-one correspondence with the data to be written.

Optionally, the storage system further includes a critical state excitation component. The control unit 252 is further configured to control the critical state excitation component to process a to-be-reacted area of the recording medium, to allow the to-be-reacted area to be in at least one of a spatial profile change critical state, a physical feature change critical state, or a chemical feature change critical state. The to-be-reacted area includes the target area. The control unit 252 is further configured to control the charged particle beam array to act on the target area that is processed by the critical state excitation component.

For example, with reference to FIG. 6, the control unit 252 may be used to perform S106 and S107.

Optionally, the control unit 252 is further configured to process the to-be-reacted area of the recording medium by using at least one of heat, a laser, ultrasound, an ion beam, a plasma, or gas generated by the critical state excitation component. The gas is gas that allows the recording medium to improve physical or chemical activity.

For example, with reference to FIG. 6, the control unit 252 may be used to perform S107.

Optionally, the charged particle includes at least one of an electron, an ion, and a plasma.

Optionally, the target modulation feature includes at least one of a shape, a spatial energy distribution, a temporal energy distribution, or a spatial action angle of the charged particle beam in the charged particle beam array.

For specific descriptions of the optional manners, refer to the method embodiments. Details are not described herein again. In addition, for any explanation of the data writing apparatus 250 provided above and descriptions of beneficial effects, refer to the foregoing corresponding method embodiments. Details are not described herein again.

For example, with reference to FIG. 1, a function implemented by the control unit 252 in the data writing apparatus 250 may be implemented by the processor 101 in FIG. 1 by executing the program code in the memory 105 in FIG. 1. A function implemented by the obtaining unit 251 may be implemented through the communications interface 108 in FIG. 1.

Figure 26:
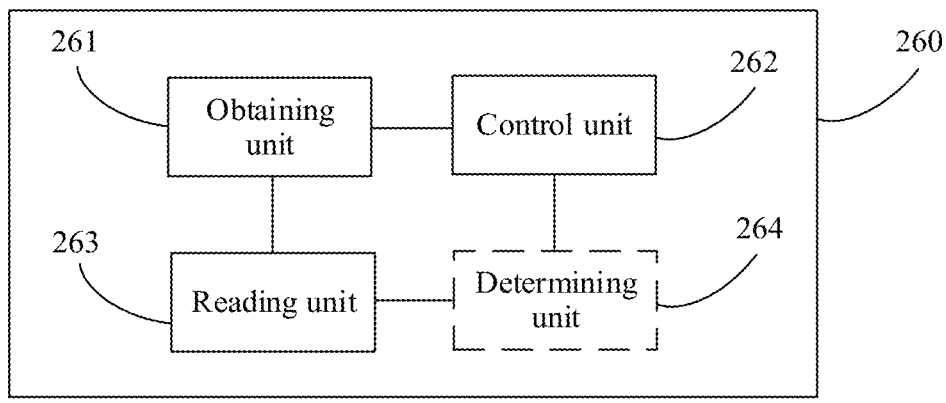
FIG. 26 is a schematic diagram of a structure of a data reading apparatus according to an embodiment of this disclosure.

FIG. 26 shows a schematic diagram of a structure of a data reading apparatus 260 according to an embodiment of this disclosure. The data reading apparatus 260 is used in a storage system. The storage system further includes a charged particle beam excitation modulation component and a recording medium. The recording medium is configured to store to-be-read data. The data reading apparatus 260 is configured to perform the data reading method, for example, is configured to perform the method shown in FIG. 24. The data reading apparatus 260 may include an obtaining unit 261, a control unit 262, and a reading unit 263.

The obtaining unit 261 is configured to obtain a read request, where the read request is used to request to read the to-be-read data. The control unit 262 is configured to control, based on the read request, the charged particle beam excitation modulation component to generate a charged particle beam array with a target modulation feature. The charged particle beam array includes one or more charged particle beams. The control unit 262 is further configured to control the charged particle beams in the charged particle beam array to act on a reacting area of the recording medium, to determine a target recording feature of a target area. The reacting area includes the target area. The target recording feature includes a spatial profile feature and at least either of a physical feature and a chemical feature. The to-be-read data is corresponding to the target recording feature. The reading unit 263 is configured to read, based on the determined target recording feature, the to-be-read data.

For example, with reference to FIG. 24, the obtaining unit 261 may be used to perform S201, and the reading unit 263 may be used to perform S204.

Optionally, the storage system further includes a charged particle beam imaging component. The control unit 262 is further configured to control the charged particle beam imaging component to obtain a charged particle image obtained by acting on the charged particle beams in the charged particle beam array on the target area. The data reading apparatus 260 further includes a determining unit 264. The determining unit 264 is configured to determine the target recording feature of the target area based on the obtained charged particle image.

For example, with reference to FIG. 24, the determining unit 264 may be used to perform S203.

Optionally, when the charged particle beam array acts on the target area, the target recording feature of the target area is not changed or damaged.

Optionally, the storage system further includes a scan control component. The scan control component is configured to control, based on a preset scan path, the charged particle beam array to act on the recording medium. The control unit 262 is further configured to control the scan control component based on the preset scan path, to control the charged particle beam array to act on the reacting area of the recording medium.

Optionally, the recording feature includes the spatial profile feature. The spatial profile feature includes a circular spatial profile feature, and circular spatial profile features of different diameters are in a one-to-one correspondence with the data to be read. Alternatively, the recording feature includes the spatial profile feature. The spatial profile feature includes an elliptical spatial profile feature, and elliptical spatial profile features of different sizes are in a one-to-one correspondence with the data to be read. Alternatively, the recording feature includes at least either of the physical feature and the chemical feature, and the spatial profile feature. The spatial profile feature includes a circular spatial profile feature, the physical feature includes a physical feature in the circular spatial profile feature of the recording medium, and the chemical feature includes a chemical feature in the circular spatial profile feature of the recording medium. Circular spatial profile features of different diameters that include at least either of the physical feature and the chemical feature are in a one-to-one correspondence with the data to be read. Alternatively, the recording feature includes at least either of the physical feature and the chemical feature, and the spatial profile feature. The spatial profile feature includes an elliptical spatial profile feature, the physical feature includes a physical feature in the elliptical spatial profile feature of the recording medium, and the chemical feature includes a chemical feature in the elliptical spatial profile feature of the recording medium. Elliptical spatial profile features of different sizes that include at least either of the physical feature and the chemical feature are in a one-to-one correspondence with the data to be read.

Optionally, the charged particle includes at least one of an electron, an ion, and a plasma.

Optionally, the target modulation feature includes at least one of a shape, a spatial energy distribution, a temporal energy distribution, or a spatial action angle of the charged particle beam in the charged particle beam array.

For specific descriptions of the optional manners, refer to the method embodiments. Details are not described herein again. In addition, for descriptions of any explanation and beneficial effect of the data reading apparatus 260 provided above, refer to the foregoing corresponding method embodiments, and details are not described herein again.

For example, with reference to FIG. 1, a function implemented by the control unit 262, the reading unit 263, and the determining unit 264 in the data reading apparatus 260 may be implemented by the processor 101 in FIG. 1 by executing the program code in the memory 105 in FIG. 1. A function implemented by the obtaining unit 261 may be implemented through the communications interface 108 in FIG. 1.

Another embodiment of this disclosure further provides a computer-readable storage medium. The computer-readable storage medium stores an instruction. When the instruction runs on the data writing apparatus and the data reading apparatus, the data writing apparatus and the data reading apparatus perform the steps performed by the data writing apparatus and the data reading apparatus in the method procedure shown in the foregoing method embodiment.

In some embodiments, the disclosed methods may be implemented as computer program instructions encoded in a machine-readable format on a computer-readable storage medium or encoded on another non-transitory medium or product.

Figure 27:
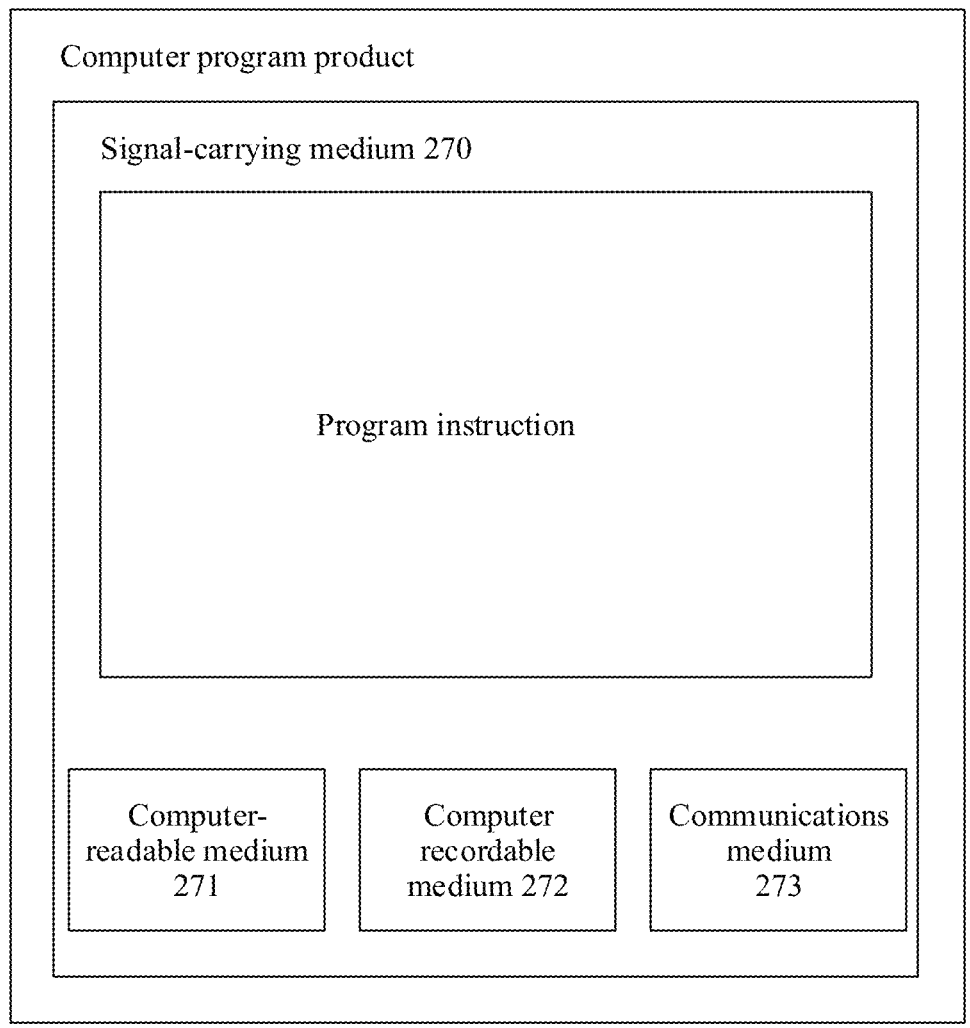
FIG. 27 is a schematic diagram of a structure of a computer program product according to an embodiment of this disclosure.

FIG. 27 schematically shows a conceptual partial view of a computer program product according to an embodiment of this disclosure. The computer program product includes a computer program used to execute a computer process on a computing device.

In an embodiment, the computer program product is provided by using a signal-carrying medium 270. The signal-carrying medium 270 may include one or more program instructions. When the program instructions are run by one or more processors, the functions or some of the functions described for FIG. 6 or FIG. 24 may be provided. Therefore, for example, one or more features described with reference to S101 to S107 in FIG. 6 may be borne by one or more instructions associated with the signal-carrying medium 270. In addition, the program instructions in FIG. 27 are also described as example instructions.

In some examples, the signal-carrying medium 270 may include a computer-readable medium 271, for example, but not limited to, a hard disk drive, a compact disc (CD), a DIGITAL VERSATILE DISC (DVD), a digital tape, a memory, a ROM, or a RAM.

In some implementations, the signal-carrying medium 270 may include a computer recordable medium 272, for example, but not limited to, a memory, a read/write (R/W) CD, or an R/W DVD.

In some implementations, the signal-carrying medium 270 may include a communications medium 273, for example, but not limited to, a digital and/or analog communications medium (for example, an optical fiber cable, a waveguide, a wired communications link, or a wireless communications link).

The signal-carrying medium 270 may be conveyed by a communications medium 273 in a wireless form (for example, a wireless communications medium that complies with the Institute of Electrical and Electronics Engineers (IEEE) 802.11 standard or another transmission protocol). The one or more program instructions may be, for example, one or more computer-executable instructions or one or more logic implementation instructions.

In some examples, the data writing apparatus and the data reading apparatus described in FIG. 6 or FIG. 24 may be configured to provide various operations, functions, or actions in response to one or more program instructions in the computer-readable medium 271, the computer recordable medium 272, and/or the communications medium 273.

It should be understood that the arrangement described herein is merely used as an example. Thus, persons skilled in the art appreciate that another arrangement and another element (for example, a machine, an interface, a function, a sequence, and an array of functions) can be used to replace the arrangement, and some elements may be omitted together depending on a desired result. In addition, many of the described elements are functional entities that can be implemented as discrete or distributed components, or implemented in any suitable combination at any suitable position in combination with another component.

All or some of the foregoing embodiments may be implemented by using software, hardware, firmware, or any combination thereof. When a software program is used to implement embodiments, embodiments may be implemented completely or partially in a form of a computer program product. The computer program product includes one or more computer instructions. When the computer-executable instructions are loaded and executed on a computer, the procedures or functions according to embodiments of this disclosure are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A method implemented by a processor of a storage system, wherein the method comprises:
 obtaining to-be-written data;
 controlling, based on the to-be-written data, a charged particle beam excitation modulation component of the storage system to generate a charged particle beam array comprising a target modulation feature, wherein the charged particle beam array comprises one or more charged particle beams, and wherein the target modulation feature comprises at least one of a shape of a charged particle beam in the charged particle beam array, a spatial energy distribution of the charged particle beam, a temporal energy distribution of the charged particle beam, or a spatial action angle of the charged particle beam;

controlling the one or more charged particle beams to act on an auxiliary material layer on a recording medium of the storage system to generate, on the auxiliary material layer, an auxiliary feature corresponding to the to-be-written data; and controlling the one or more charged particle beams to act on the recording medium, to generate, in a target area of the recording medium, a target recording feature corresponding to the to-be-written data, wherein the auxiliary feature generates, in the target area, the target recording feature, and wherein the auxiliary material layer comprises one or more layers.

2. The method of claim 1, wherein controlling the charged particle beam excitation modulation component to generate the charged particle beam array comprises controlling, based on a predetermined mapping relationship, the charged particle beam excitation modulation component to generate the charged particle beam array, wherein the predetermined mapping relationship defines a correspondence between data to be written and a modulation feature of the charged particle beam array, wherein the method further comprises generating, by the charged particle beam array using the modulation feature on the recording medium, a recording feature corresponding to the data to be written, and wherein the recording feature comprises a spatial profile feature and either of a first physical feature or a first chemical feature.

3. The method of claim 2, wherein the spatial profile feature comprises a circular spatial profile feature, wherein first circular spatial profile features of different diameters are in a one-to-one correspondence with the data to be written.

4. The method of claim 2, wherein the spatial profile feature comprises an elliptical spatial profile feature, wherein first elliptical spatial profile features of different sizes are in a one-to-one correspondence with the data to be written.

5. The method of claim 2, wherein the spatial profile feature comprises the circular spatial profile feature, wherein the first physical feature comprises a second physical feature in the circular spatial profile feature, wherein the first chemical feature comprises a second chemical feature in the circular spatial profile feature, and wherein second circular spatial profile features of different diameters that comprise either of the first physical feature or the first chemical feature are in a one-to-one correspondence with the data to be written.

6. The method of claim 2, wherein the spatial profile feature comprises the elliptical spatial profile feature, wherein the first physical feature comprises a third physical feature in the elliptical spatial profile feature, wherein the first chemical feature comprises a third chemical feature in the elliptical spatial profile feature, and wherein second elliptical spatial profile features of different sizes that comprise either of the first physical feature or the first chemical feature are in a one-to-one correspondence with the data to be written.

7. The method of claim 1, wherein controlling the one or more charged particle beams to act on the recording medium comprises controlling, based on a preset scan path, a scan control component of the storage system to control the charged particle beam array to act on the target area.

8. The method of claim 1, further comprising controlling, before controlling the one or more charged particle beams to act on the recording medium, a critical state excitation component of the storage system to process a to-be-reacted area of the recording medium to allow the to-be-reacted area to be in at least one of a spatial profile change critical state, a physical feature change critical state, or a chemical feature change critical state, wherein the to-be-reacted area comprises the target area.

9. The method of claim 8, wherein controlling the critical state excitation component to process the to-be-reacted area comprises processing the to-be-reacted area using at least one of heat of the critical state excitation component, a laser of the critical state excitation component, ultrasound of the critical state excitation component, an ion beam of the critical state excitation component, a plasma of the critical state excitation component, or a gas of the critical state excitation component, and wherein the gas allows the recording medium to improve physical activity or chemical activity.

10. A method implemented by a processor of a storage system, wherein the method comprises:

obtaining a read request requesting to read to-be-read data of a recording medium of the storage system;

controlling, based on the read request, a charged particle beam excitation modulation component of the storage system to generate a charged particle beam array comprising a target modulation feature, wherein the charged particle beam array comprises one or more charged particle beams, and wherein the target modulation feature comprises at least one of a shape of a charged particle beam in the charged particle beam array, a spatial energy distribution of the charged particle beam, a temporal energy distribution of the charged particle beam, or a spatial action angle of the charged particle beam;

controlling the one or more charged particle beams to act on a reacting area of the recording medium;

controlling a charged particle beam imaging component of the storage system to obtain a charged particle image by acting on the one or more charged particle beams on a target area; and reading, based on a target recording feature, the to-be-read data, wherein the target recording feature is based on the charged particle image, wherein the target recording feature comprises a spatial profile feature and either of a first physical feature or a first chemical feature, wherein the reacting area comprises the target area, and wherein the to-be-read data corresponds to the target recording feature.

11. The method of claim 10, wherein the target recording feature is not changed or damaged when the charged particle beam array acts on the target area.

12. The method of claim 10, wherein controlling the one or more charged particle beams to act on the reacting area comprises controlling a scan control component of the storage system based on a preset scan path to control the charged particle beam array to act on the reacting area.

13. The method of claim 10, wherein:

the spatial profile feature comprises a circular spatial profile feature, and wherein first circular spatial profile features of different diameters are in a one-to-one correspondence with data to be read;

the spatial profile feature comprises an elliptical spatial profile feature, and wherein first elliptical spatial profile features of different sizes are in a one-to-one correspondence with the data to be read;

the spatial profile feature comprises the circular spatial profile feature, wherein the first physical feature comprises a second physical feature in the circular spatial profile feature, wherein the first chemical feature comprises a second chemical feature in the circular spatial profile feature, and wherein second circular spatial profile features of different diameters that comprise either of the first physical feature or the first chemical feature are in a one-to-one correspondence with the data to be read; or the spatial profile feature comprises the elliptical spatial profile feature, wherein the first physical feature comprises a third physical feature in the elliptical spatial profile feature, wherein the first chemical feature comprises a third chemical feature in the elliptical spatial profile feature, and wherein second elliptical spatial profile features of different sizes that comprise either of the first physical feature or the first chemical feature are in a one-to-one correspondence with the data to be read.

14. The method of claim 10, wherein a charged particle comprises at least one of an electron, an ion, or a plasma.

15. An apparatus of a storage system comprising:
a memory configured to store computer instructions; and
a processor coupled to the memory and configured to invoke the computer instructions to cause the apparatus to:
obtain to-be-written data;
control, based on the to-be-written data, a charged particle beam excitation modulation component of the storage system to generate a charged particle beam array comprising a target modulation feature, wherein the charged particle beam array comprises one or more charged particle beams, and wherein the target modulation feature comprises at least one of a shape of a charged particle beam in the charged particle beam array, a spatial energy distribution of the charged particle beam, a temporal energy distribution of the charged particle beam, or a spatial action angle of the charged particle beam;
control the one or more charged particle beams to act on an auxiliary material layer on a recording medium of the storage system to generate, on the auxiliary material layer, an auxiliary feature corresponding to the to-be-written data; and
control the one or more charged particle beams to act on the recording medium, to generate, in a target area of the recording medium, a target recording feature corresponding to the to-be-written data, wherein the auxiliary feature generates, in the target area, the target recording feature, and
wherein the auxiliary material layer comprises one or more layers.

16. The apparatus of claim 15, wherein when controlling the charged particle beam excitation modulation component to generate the charged particle beam array, the processor is further configured to invoke the computer instructions to cause the apparatus to further control, based on a predetermined mapping relationship, the charged particle beam excitation modulation component to generate the charged particle beam array, wherein the predetermined mapping relationship defines a correspondence between data to be written and a modulation feature of the charged particle beam array, wherein the processor is further configured to invoke the computer instructions to cause the apparatus to generate, by the charged particle beam array using the modulation feature on the recording medium, a recording feature corresponding to the data to be written, and wherein the recording feature comprises a spatial profile feature and either of a first physical feature or a first chemical feature.

17. The apparatus of claim 16, wherein:
the spatial profile feature comprises a circular spatial profile feature, and wherein first circular spatial profile features of different diameters are in a one-to-one correspondence with the data to be written;
the spatial profile feature comprises an elliptical spatial profile feature, and wherein first elliptical spatial profile features of different sizes are in a one-to-one correspondence with the data to be written;
the spatial profile feature comprises the circular spatial profile feature, wherein the first physical feature comprises a second physical feature in the circular spatial profile feature, wherein the first chemical feature comprises a second chemical feature in the circular spatial profile feature, and wherein second circular spatial profile features of different diameters that comprise either of the first physical feature or the first chemical feature are in a one-to-one correspondence with the data to be written; or
the spatial profile feature comprises the elliptical spatial profile feature, wherein the first physical feature comprises a third physical feature in the elliptical spatial profile feature, wherein the first chemical feature comprises a third chemical feature in the elliptical spatial profile feature, and wherein second elliptical spatial profile features of different sizes that comprise either of the first physical feature or the first chemical feature are in a one-to-one correspondence with the data to be written.

18. The apparatus of claim 15, wherein when controlling the one or more charged particle beams to act on the recording medium, the processor is further configured to invoke the computer instructions to cause the apparatus to control, based on a preset scan path, a scan control component of the storage system to control the charged particle beam array to act on the target area.

19. The apparatus of claim 15, wherein the processor is further configured to invoke the computer instructions to cause the apparatus to control a critical state excitation component of the storage system to process a to-be-reacted area of the recording medium to allow the to-be-reacted area to be in at least one of a spatial profile change critical state, a physical feature change critical state, or a chemical feature change critical state, wherein the to-be-reacted area comprises the target area,
wherein when controlling the one or more charged particle beams to act on the recording medium, the processor is further configured to invoke the computer instructions to cause the apparatus to further control the charged particle beam array to act on the target area that is processed by the critical state excitation component.

20. The apparatus of claim 19, wherein when controlling the critical state excitation component to process the to-be-reacted area, the processor is further configured to invoke the computer instructions to cause the apparatus to process the to-be-reacted area using at least one of heat of the critical state excitation component, a laser of the critical state excitation component, ultrasound of the critical state excitation component, an ion beam of the critical state excitation component, a plasma of the critical state excitation component, or a gas of the critical state excitation component, and wherein the gas allows the recording medium to improve physical activity or chemical activity.

* * * * *